(12) United States Patent
Hyun et al.

(10) Patent No.: US 9,620,195 B1
(45) Date of Patent: Apr. 11, 2017

(54) MEMORY DEVICE

(71) Applicant: SK hynix Inc., Gyeonggi-do (KR)

(72) Inventors: Sang-Ah Hyun, Gyeonggi-do (KR); Jeong-Tae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/236,267

(22) Filed: Aug. 12, 2016

(30) Foreign Application Priority Data

Mar. 18, 2016 (KR) .................. 10-2016-0032759

(51) Int. Cl.
| | |
|---|---|
| G11C 7/00 | (2006.01) |
| G11C 11/406 | (2006.01) |
| G11C 11/408 | (2006.01) |
| G11C 11/4074 | (2006.01) |
| G11C 29/02 | (2006.01) |
| G11C 8/18 | (2006.01) |
| G11C 11/4076 | (2006.01) |

(52) U.S. Cl.
CPC .......... *G11C 11/40618* (2013.01); *G11C 8/18* (2013.01); *G11C 11/406* (2013.01); *G11C 11/4074* (2013.01); *G11C 11/4076* (2013.01); *G11C 11/4087* (2013.01); *G11C 11/40626* (2013.01); *G11C 29/02* (2013.01)

(58) Field of Classification Search
CPC .......... G11C 11/4063; G11C 11/40626; G11C 11/4087; G11C 11/406; G11C 11/4076; G11C 11/4074; G11C 8/18; G11C 29/02
USPC ....................................... 365/222
See application file for complete search history.

(56) References Cited

U.S. PATENT DOCUMENTS

| | | | | | |
|---|---|---|---|---|---|
| 5,999,472 | A | * | 12/1999 | Sakurai | G11C 11/40618 365/222 |
| 7,961,543 | B2 | * | 6/2011 | Koshita | G11C 8/04 365/222 |
| 8,094,512 | B2 | * | 1/2012 | Fukiage | G11C 11/406 365/189.05 |
| 8,493,809 | B2 | * | 7/2013 | Lee | G11C 11/40618 365/195 |

FOREIGN PATENT DOCUMENTS

| | | |
|---|---|---|
| KR | 1020140028733 | 3/2014 |
| KR | 1020150071371 | 6/2015 |
| KR | 1020160030716 | 3/2016 |

* cited by examiner

*Primary Examiner* — Pho M Luu
(74) *Attorney, Agent, or Firm* — IP & T Group LLP

(57) ABSTRACT

A memory device may include a plurality of memory banks; a setting circuit capable of setting at least one of an advanced refresh mode and a piled refresh mode; and a refresh control unit capable of controlling the plurality of memory banks into a plurality of groups and for activating the plurality of groups to be refreshed at different times when a refresh command is applied, wherein the refresh control unit divides the memory banks into first groups determined based on the piled refresh mode and refreshes the first groups once, while, in the advanced refresh mode, the refresh control unit divides the memory banks into second groups determined based on the piled refresh mode and additional setting information and refresh the second groups a first number of times, which is more than two and determined based on the additional setting information.

22 Claims, 24 Drawing Sheets

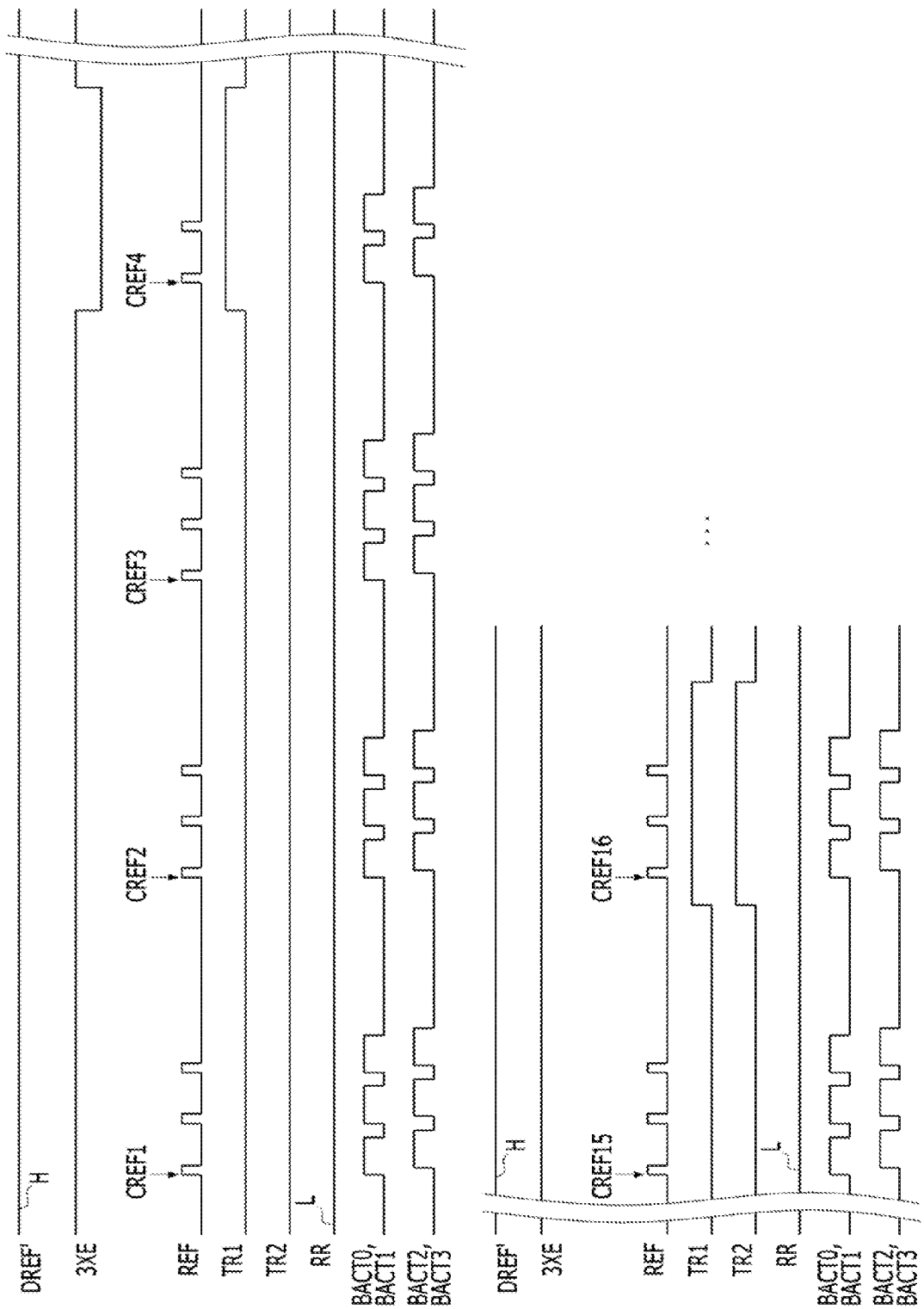

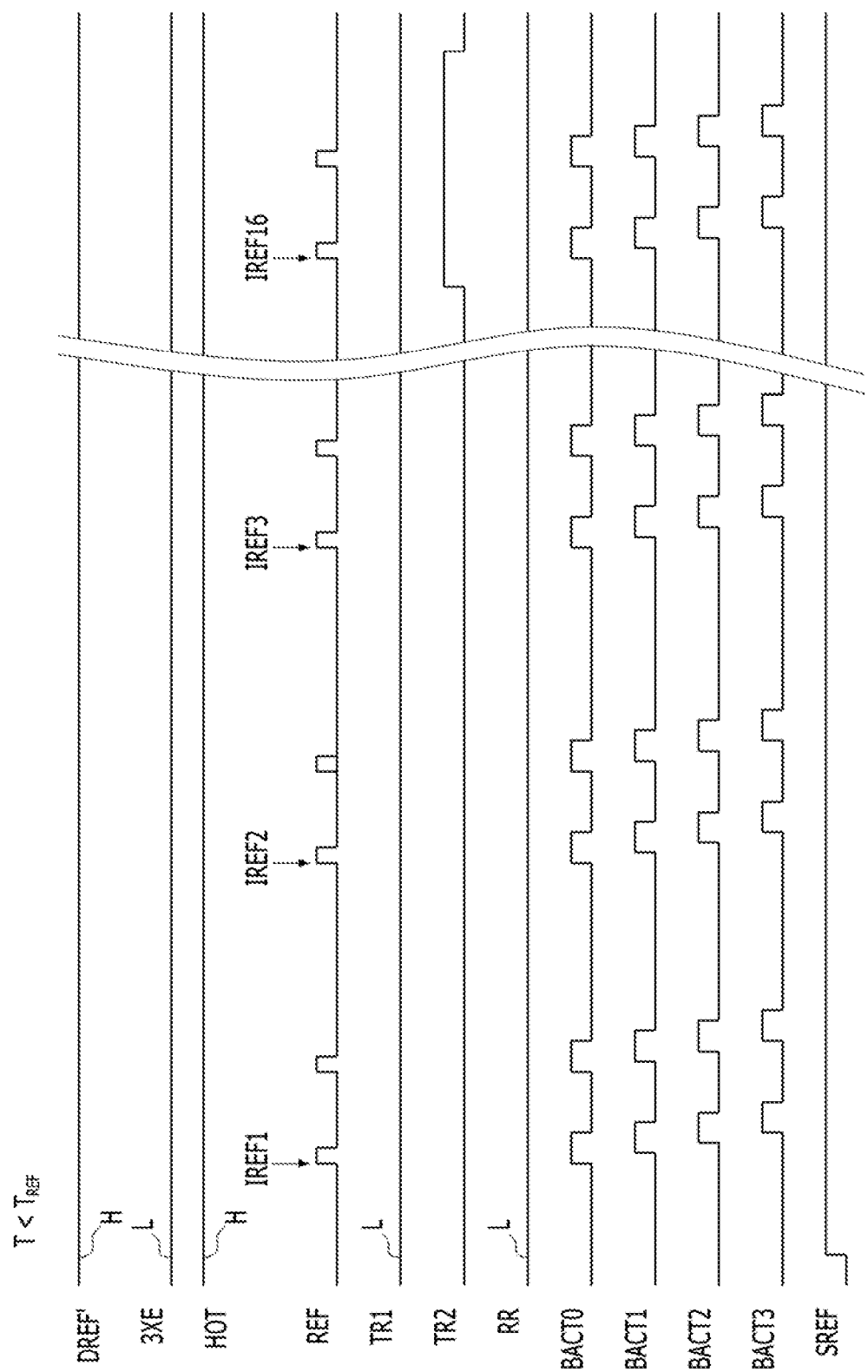

MEMORY DEVICE

CROSS-REFERENCE TO RELATED APPLICATION(S)

The present application claims priority under 35 U.S.C. §119(a) to Korean Patent Application No. 10-2016-0032759, filed on Mar. 18, 2016, the disclosure of which is incorporated herein by reference in its entirety.

BACKGROUND

1. Field

Exemplary embodiments of the present invention relate generally to a memory device.

2. Description of the Related Art

A memory cell of a memory device includes a transistor serving as a switch and a capacitor for storing data in the form of charges. "High" (logic 1) or "Low" (logic 0) logic data is determined depending on whether or not there is a charge in the capacitor of the memory cell, that is, whether a terminal voltage of the capacitor is high or low.

In principle, the retention of data does not consume power because the data is retained in such a way as to maintain charges accumulated in a capacitor. However, the data may be lost because the initial amount of charges stored in the capacitor is lost due to a leakage current attributable to the PN junction of a MOS transistor. To prevent such a loss, data within a memory cell is read before the data is lost, and the normal amount of charge is recharged based on the read information. Data is maintained only when such an operation is periodically repeated. Such a process for recharging cell charges is called a refresh operation.

A refresh operation is performed whenever a memory controller inputs a refresh command to a memory device. The memory controller inputs the refresh command to the memory device at a specific time interval by taking the data retention time of the memory device into consideration. The data retention time is indicative of the time during which the data of a memory cell can be retained without a refresh operation. Memory cells included in a memory device are designed to have a data retention time that is equal to or greater than a specific reference retention time. Thus, a time interval between consecutive refresh operations may be determined by taking the reference retention time of the device into consideration.

If some memory cells have a data retention time that is less than the device reference retention time due to some internal or external factor, there is an increasing possibility that these memory cells may lose their stored data. An internal factor that may cause a memory cell to have a lower retention time than the device reference retention time may be a cell defect. For example, when the cell capacitor of a memory cell has low capacitance or the cell transistor of a memory cell has high leakage current, these are internal factors that may influence the data retention time of the memory cell. Such a memory cell may also be referred to as a weak cell, and a word line to which the weak memory cell is coupled may also be referred to as a weak word line.

An external factor that may influence the data retention time of a memory cell of a memory device may include the temperature of the memory device and the voltage of an adjacent memory cell or a word line. For example, the data retention time of a memory cell is reduced due to a change in the temperature of a memory device. The amount of charges stored in a memory cell is influenced by the active and precharge operation of a word line adjacent to a word line to which the memory cell is coupled.

FIG. 1 is a diagram illustrating part of a cell array included in a memory device for explaining the influence of an external factor thereon. Reference "BL" denotes a bit line.

Referring to FIG. 1, three word lines WLK−1, WLK, and WLK+1 are disposed in parallel within the cell array. The word line WLK indicated by a reference "ATTACK_ACT" has a great number of active times, high active frequency, or a long active time, compared to the others. The word lines WLK−1 and WLK+1 are disposed adjacent to the word line WLK. Memory cells CELL_K−1, CELL_K, and CELL_K+1 are coupled to the word lines WLK−1, WLK, and WLK+1, respectively. The memory cells CELL_K−1, CELL_K, and CELL_K+1 include cell transistors TR_K−1, TR_K, and TR_K+1 and cell capacitors CAP_K−1, CAP_K, and CAP_K+1, respectively.

In FIG. 1, when the word line WLK is activated many times within a period of time, i.e., frequently, the voltage of the word line WLK is frequently toggled. When the word line WLK is activated for a long time the word line WLK maintains a high voltage for a long time. Coupling phenomena may be generated between the word line WLK and the word lines WLK−1 and WLK+1 and affect data stored in the memory cells CELL_K−1 and CELL_K+1 coupled to the word lines WLK−1 and WLK+1 which may negatively affect the data retention time of these cells.

Hence, further improvements are needed to reduce or overcome the aforementioned problems of prior art memory devices.

SUMMARY

Various embodiments are directed to a memory device capable of flexibly adjusting the number of memory banks on which a refresh operation is performed at the same time and the number of times that memory banks are refreshed in response to one refresh command depending on various conditions.

In an embodiment, a memory device may include a plurality of memory banks; a setting circuit capable of setting at least one of an advanced refresh mode and a piled refresh mode; and a refresh control unit capable of controlling the plurality of memory banks into a plurality of groups and for activating the plurality of groups to be refreshed at different times when a refresh command is applied, wherein the refresh control unit divides the memory banks into first groups determined based on the piled refresh mode and refreshes the first groups once, while, in the advanced refresh mode, the refresh control unit divides the memory banks into second groups determined based on the piled refresh mode and additional setting information and refresh the second groups a first number of times, which is more than two and determined based on the additional setting information.

In an embodiment, a memory device may include a plurality of memory banks; a setting circuit capable of setting an advanced refresh mode and a piled refresh mode; and a refresh control unit capable of controlling the plurality of memory banks to be divided into groups and the groups to be refreshed at different times, wherein when the refresh command is applied, the refresh control unit divides the memory banks into first groups determined based on the piled refresh mode and refreshes the first groups once, while, in the advanced refresh mode, the refresh control unit divides the memory banks into second groups determined based on the piled refresh mode and additional setting information and refresh the second groups two times or three or more times.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which:

FIGS. 16A to 16D are diagrams illustrating the operation of the memory device of FIG. 13, according to an embodiment of the present invention.

DETAILED DESCRIPTION

Figure 1:
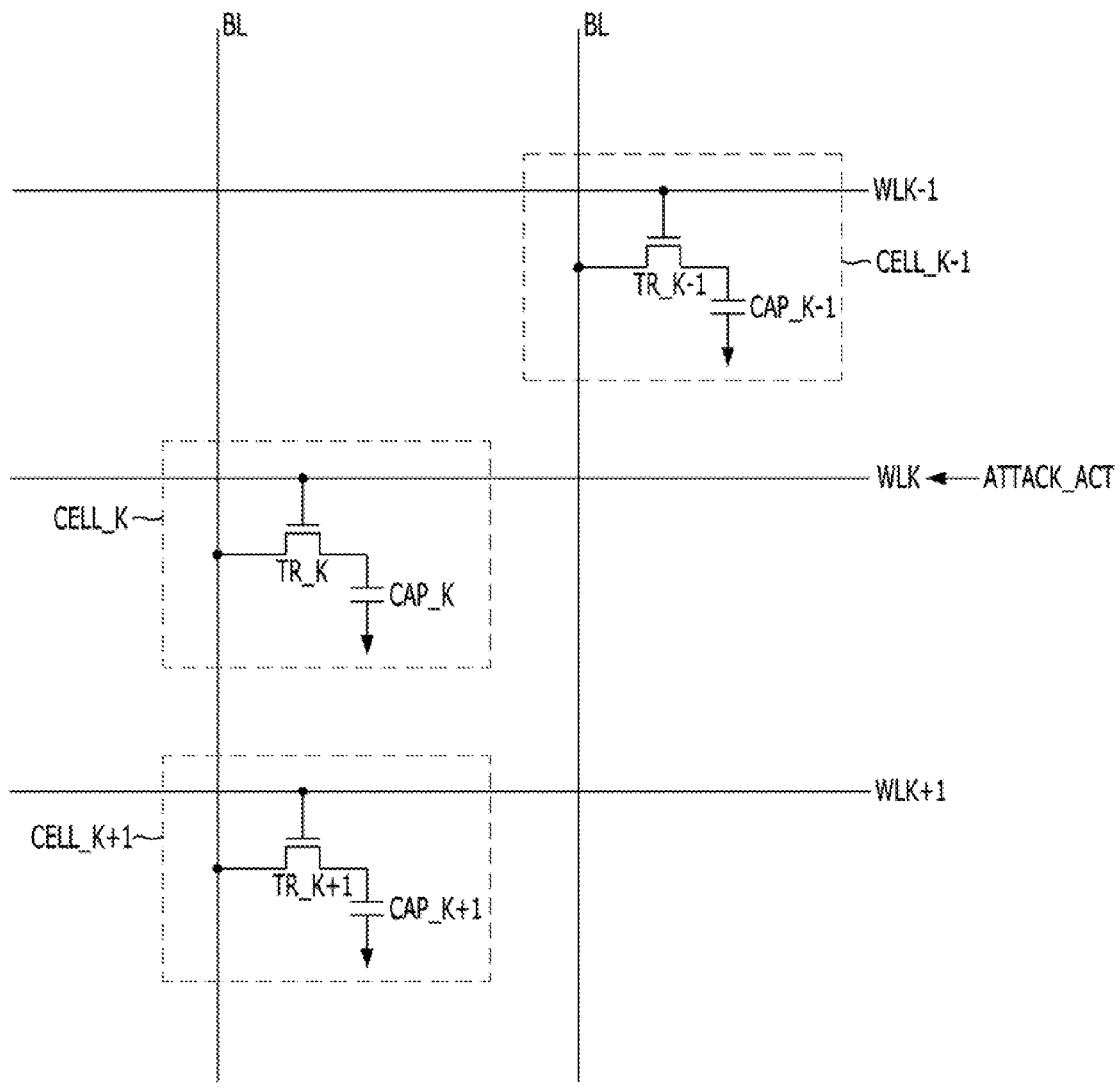
FIG. 1 is a diagram illustrating part of a cell array included in a memory device to explain the influence of an external factor thereon.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

The present invention may have diverse modifications and embodiments other than the ones described herein. Also, the constituent elements of the embodiments of the present invention should not be limited to the described elements only but also to include all modifications, substitutes and equivalents that are within the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

In some instances, as would be apparent to one of ordinary skill in the art, elements described in connection with a particular embodiment may be used singly or in combination with other embodiments unless otherwise specifically indicated.

Figure 2A:
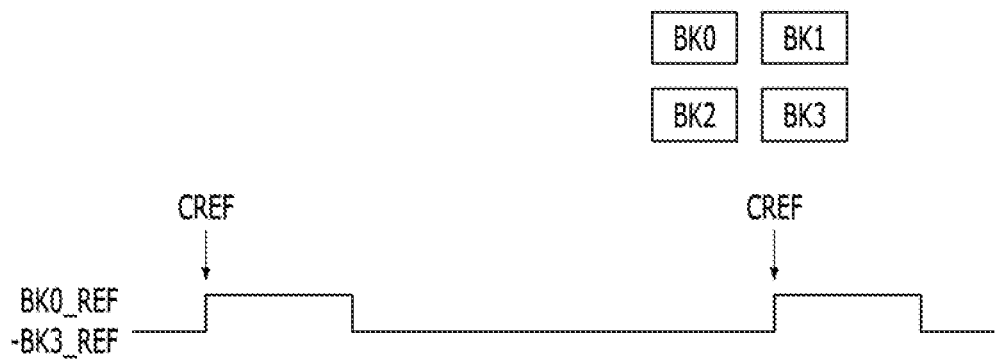
FIGS. 2A to 2C are diagrams for illustrating piled refresh operations.
Figure 2B:
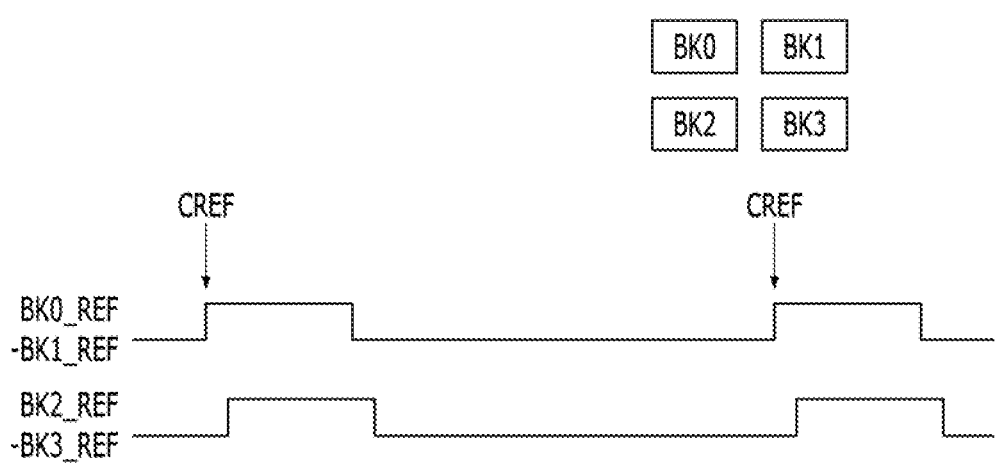
Figure 2C:
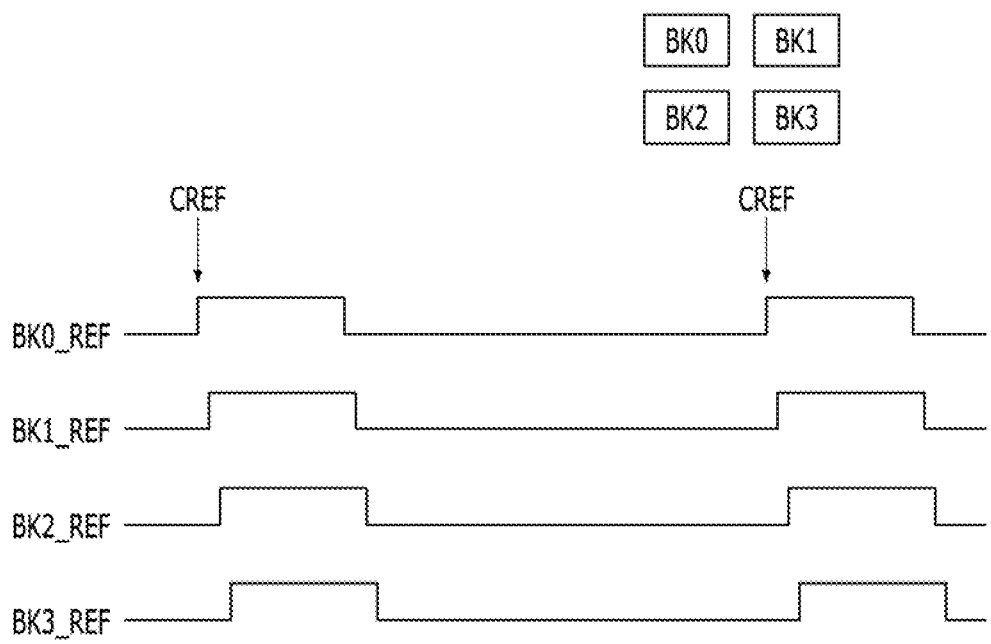

FIG. 2A illustrates a general refresh operation performed on a plurality of banks. FIGS. 2B and 2C illustrate piled refresh operations performed on a plurality of banks.

It is described as an example that the refresh operations of FIGS. 2A to 2C are performed in a memory device having 4 memory banks BK0-BK3. References 'BK0_REF-BK3_REF' denote refresh signals for refreshing the respective memory banks BK0-BK3.

A piled refresh operation includes dividing the memory banks into two or more groups. High peak current may be generated when all the memory banks are refreshed at the same time. The piled refresh operation is then be performed by activating the two or more groups with some time difference for each group for reducing peak current attributable to the refresh operations.

FIG. 2A shows a general refresh operation for refreshing all the memory banks BK0 to BK3 at the same time when a refresh command CREF is applied.

FIG. 2B shows a 2-piled refresh operation including dividing all the memory banks BK0-BK3 into two groups BK0/BK1 and BK2/BK3 and refreshing the two groups BK0/BK1 and BK2/BK3 by activating the two groups BK0/BK1 and BK2/BK3 at different times when the refresh command CREF is applied.

FIG. 2C shows a 4-piled refresh operation including dividing all the memory banks BK0-BK3 into four groups BK0, BK1, BK2, and BK3 and refreshing the four groups BK0, BK1, BK2, and BK3 by activating the four groups BK0, BK1, BK2, and BK3 at different times when the refresh command CREF is applied.

Figure 3A:
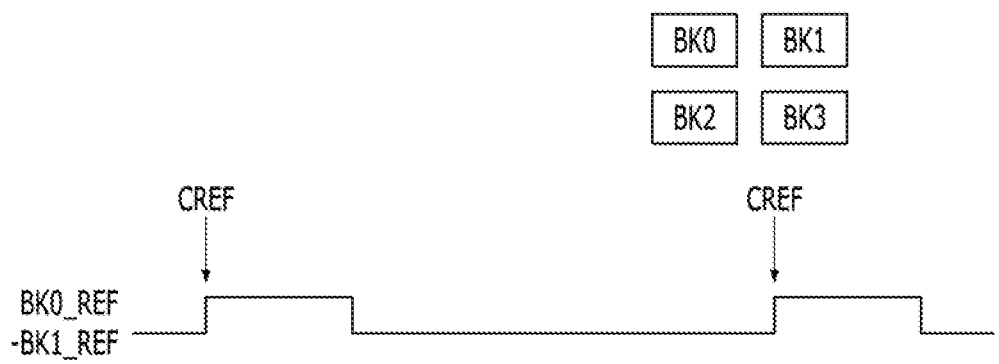
FIGS. 3A to 3E are diagrams for illustrating an advanced refresh (hereinafter referred as an "AR") operation.

FIG. 3A is a diagram illustrating a general refresh operation. FIGS. 3B to 3E illustrate an advanced refresh operation, hereinafter referred as an "AR" operation.

Referring to FIG. 3A, in the case of a general refresh operation (not an AR operation), when the refresh command CREF is once applied, all the memory banks BK0-BK3 included in a memory device may be once refreshed. In contrast, in the case of an AR operation, when the refresh command CREF is once inputted, the memory banks BK0-BK3 may be refreshed more than once.

Figure 3B:
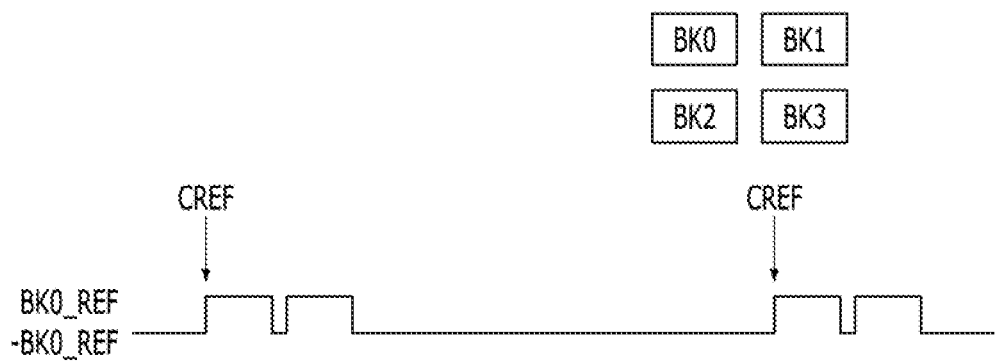

FIG. 3B is a diagram illustrating an AR operation that is repeated two times and which is referred to hereinafter as a 2× AR operation.

Referring to FIG. 3B, in the case of the 2× AR operation, when the refresh command CREF is once applied, all the memory banks BK0-BK3 included in the memory device may be twice refreshed. For reference, reference '2×' denotes the number of times (i.e., two) that the memory banks BK0-BK3 are refreshed when the refresh command CREF is once inputted.

Figure 3C:
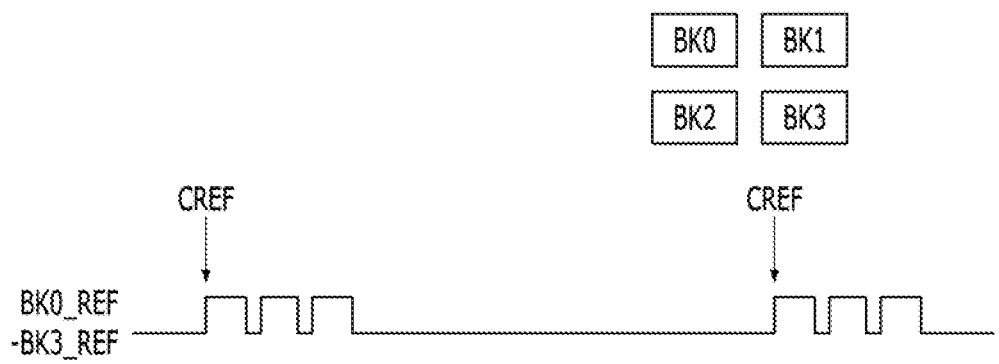

FIG. 3C is a diagram for illustrating an additional AR operation.

Referring to FIG. 3C, in the case of the additional AR operation, when the refresh command CREF is once applied, all the memory banks BK0-BK3 included in the memory device may be refreshed three times. FIGS. 3A to 3B describes as an example that the memory banks BK0-BK3 are refreshed at the fixed number of times when the refresh command CREF is once inputted. However, the number of times that the memory banks BK0-BK3 are refreshed may be changed whenever the refresh command CREF is applied.

Figure 3D:
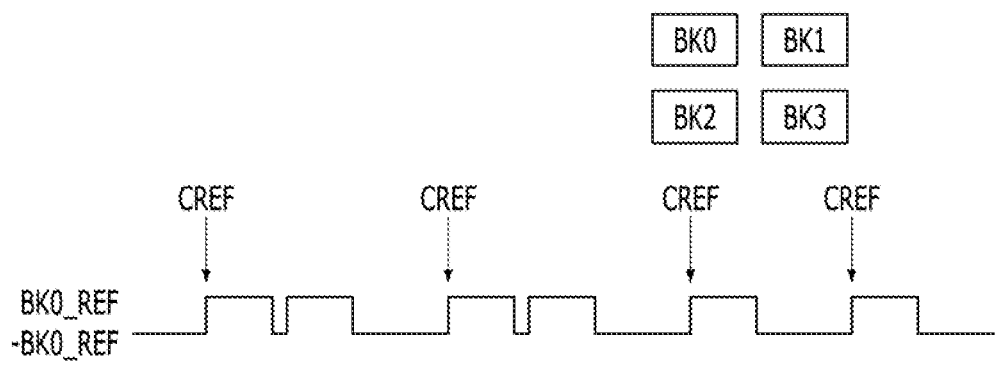

FIG. 3D is a diagram for illustrating a 1.5× AR operation.

The 1.5× AR operation may be performed on a basis of four inputs of the refresh command CREF. All the memory banks BK0-BK3 may be twice refreshed whenever the refresh command CREF is inputted a first and a second time, whereas the memory banks BK0-BK3 may be once refreshed whenever the refresh command CREF is inputted a third and a fourth time. In this case, on average, the number of times that the memory banks BK0-BK3 are refreshed when the refresh command CREF is once inputted is 1.5 times (six refresh operations/the four inputs of the refresh command), leading to the 1.5× AR operation.

Figure 3E:
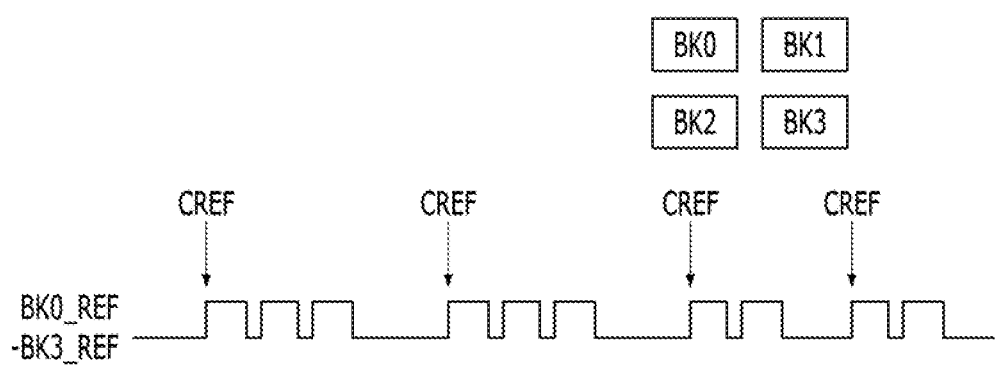

FIG. 3E is a diagram for illustrating a 2.5× AR operation.

The 2.5× AR operation may be performed on a basis of four inputs of the refresh command CREF. All the memory banks BK0-BK3 may be refreshed three times whenever the refresh command CREF is inputted a first and a second time, and the memory banks BK0-BK3 may be twice refreshed whenever the refresh command CREF is inputted a third and a fourth time. In this case, the number of times that the memory banks BK0-BK3 are refreshed when the refresh command CREF is once inputted is an average of 2.5 (ten refresh operations/the four inputs of the refresh command), leading to the 2.5× AR operation.

As described above, various AR operations may be implemented by flexibly adjusting the number of times that the memory banks BK0-BK3 are refreshed in response to the number of times that the refresh command CREF is inputted.

Figure 4A:
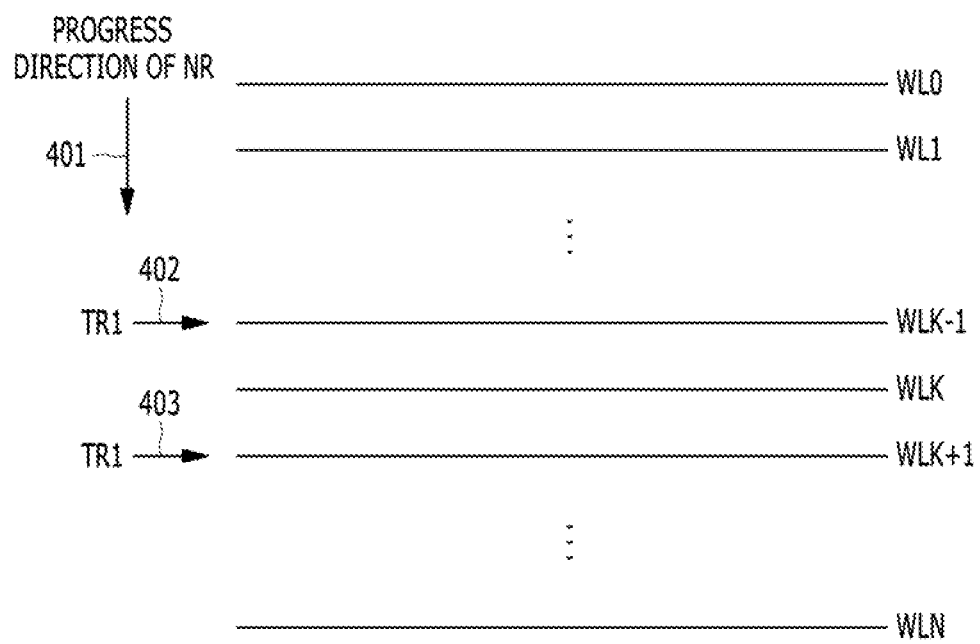
FIGS. 4A to 4B are diagrams for illustrating a target refresh (hereinafter referred as a "TR") operation.
Figure 4B:
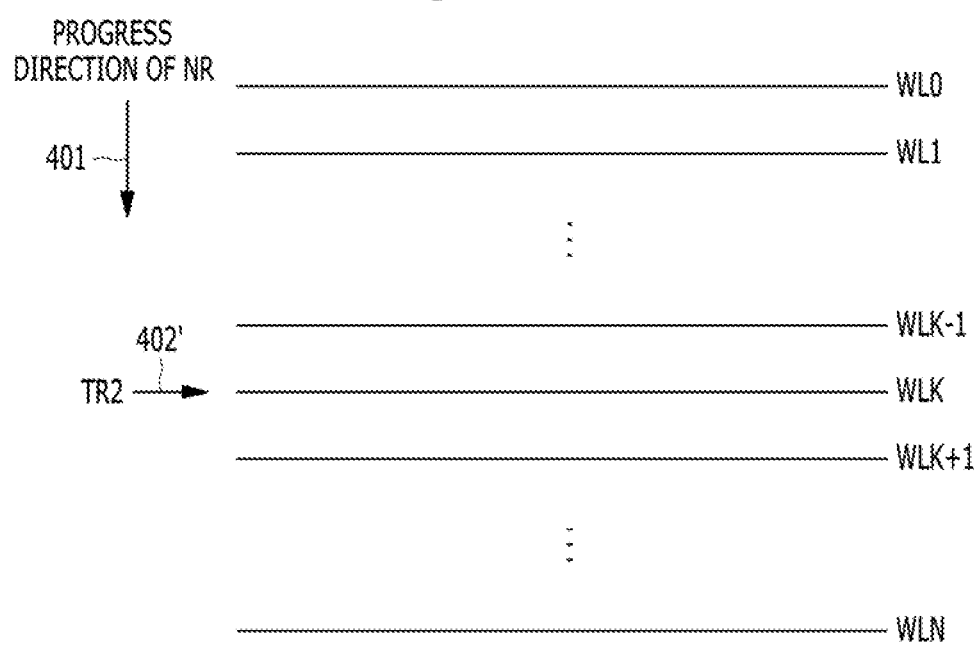

FIGS. 4A and 4B are diagrams illustrating a target refresh (hereinafter referred as a "TR") operation. FIGS. 4A and 4B show a plurality of word lines WL0-WLN (N is a natural number) included in a memory bank.

A first target refresh (hereinafter referred to as a "TR1") operation is described below with reference to FIG. 4A.

A normal refresh (hereinafter referred to as an "NR") operation indicates an operation for refreshing one or more word lines in the order of the word lines WL0 to WLN, e.g., in the direction of the arrow 401, or the opposite order thereof, when the refresh command is applied. That is, according to the example of FIG. 4A, the word lines WL0-WLN are sequentially refreshed.

The TR1 operation shows an operation for refreshing word lines adjacent to a word line corresponding to a previously stored address when the refresh command is applied. For example, if the TR1 operation is performed while the NR operation is performed, word lines WLk−1 and WLk+1 adjacent to a word line WLk corresponding to a previously stored address may be refreshed (402, 403) regardless of the NR operation that is in progress. Such a TR1 operation may be used to prevent the phenomena described above with reference to FIG. 1. Hence, the TR1 operation may reduce a risk of changing the data of memory cells coupled to adjacent word lines of a specific word line due to the active and precharge operations of the specific word line.

A second target refresh (hereinafter referred to as a "TR2") operation is described below with reference to FIG. 4B.

The TR2 operation indicates an operation for refreshing a word line corresponding to a previously stored address when the refresh command is applied. For example, if the TR2 operation is performed while the NR operation is performed, a word line WLk corresponding to a previously stored address may be refreshed (402') regardless of the NR operation that is in progress. Such a TR2 operation may be used to prevent the data of a weak memory cell from being lost. If it is difficult to retain the data of a weak memory cell through the NR operation because the data retention time of the weak memory cell is short, the data of the weak memory cell may be prevented from being lost through the TR2 operation in addition to the NR operation.

In addition, there is a redundancy refresh (RR) operation for additionally refreshing a redundancy word line used to replace normal word lines in a memory bank regardless of the NR operation for preventing the data of redundancy cells coupled to the redundancy word line from being lost.

Figure 5:
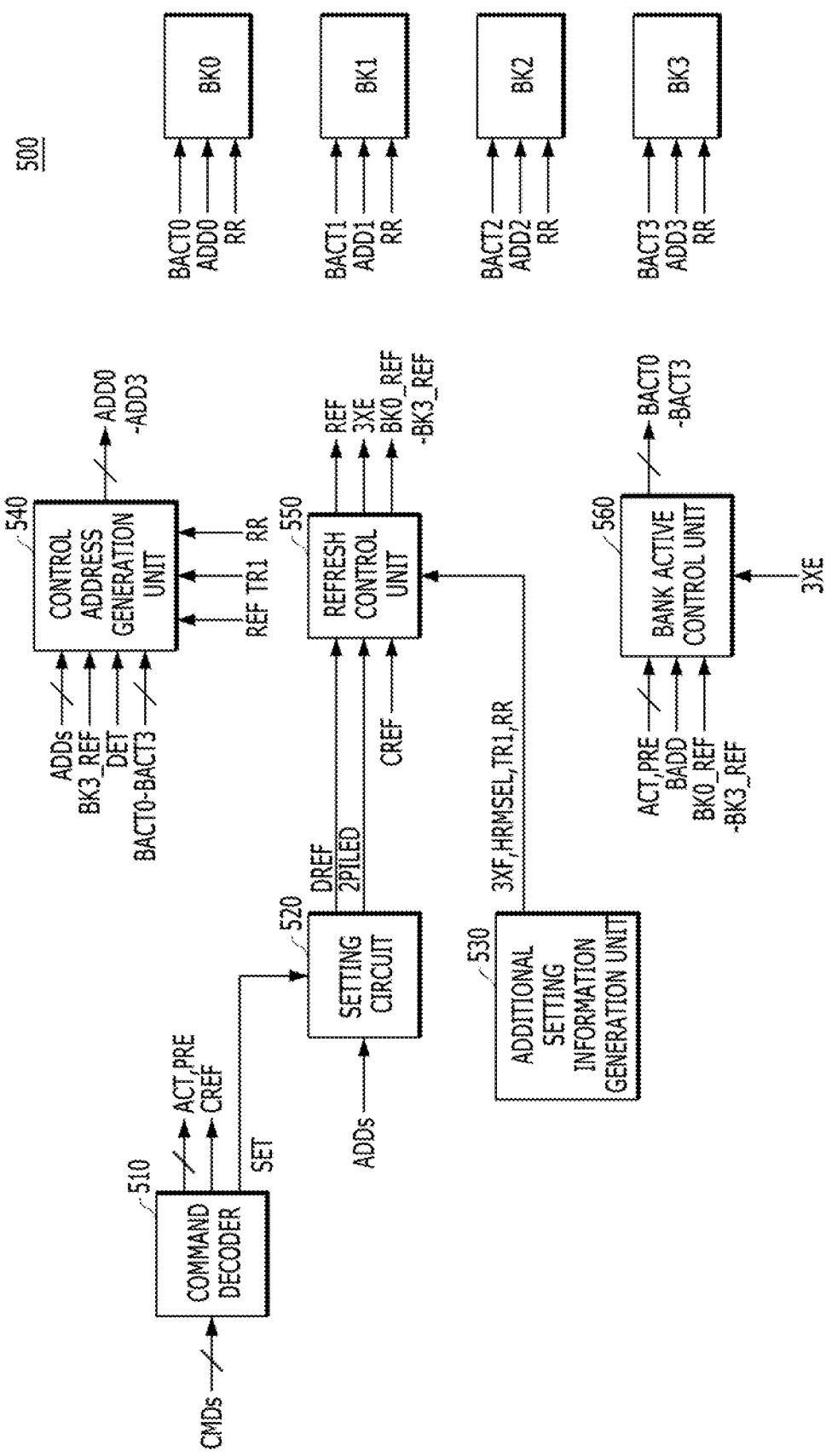
FIG. 5 is a diagram illustrating a memory device, according to an embodiment of the present invention.

Referring now to FIG. 5 a memory device 500 is provided, according to an embodiment of the present invention.

According to FIG. 5, the memory device 500 may include a plurality of memory banks BK0-BK3, a command decoder 510, a setting circuit 520, an additional setting information generation unit 530, a control address generation unit 540, a refresh control unit 550, and a bank active control unit 560.

Figure 6:
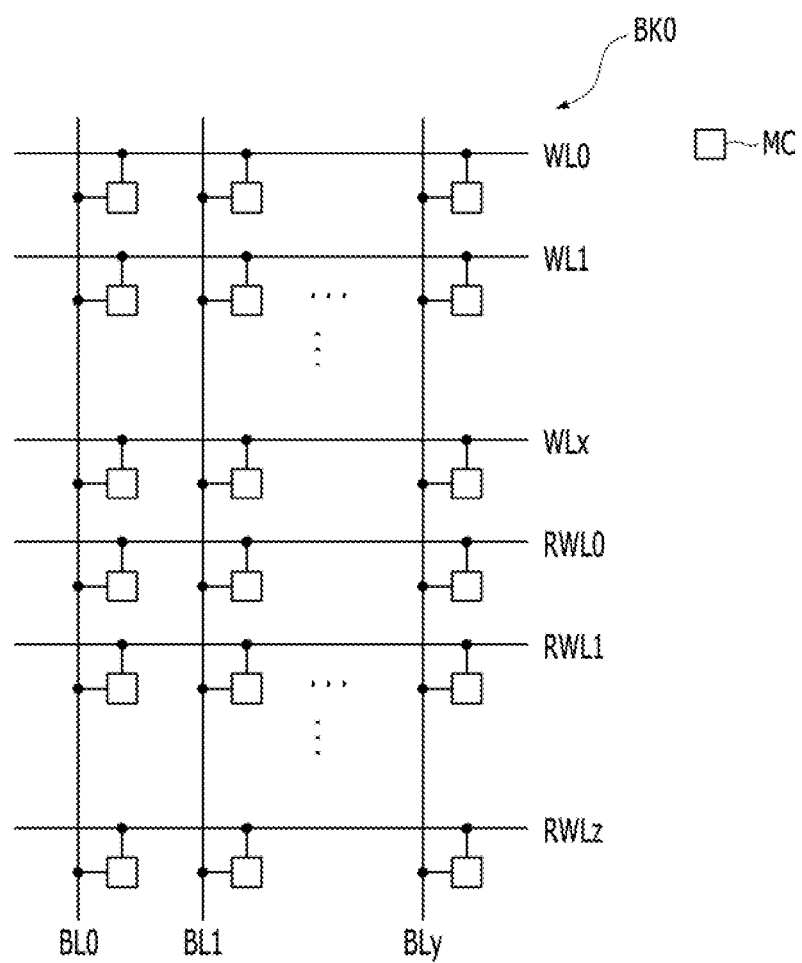
FIG. 6 is a diagram illustrating part of an example configuration of a memory bank of the memory device of FIG. 5.

FIG. 6 illustrates a part of the configuration of the memory bank BK0 of FIG. 5.

Referring to FIG. 6, the memory bank BK0 may include a plurality of word lines WL0-WLx (x is a natural number), a plurality of redundancy word lines RWL0-RWLz (z is a natural number), a plurality of bit lines BL0-BLy (y is a natural number), and a plurality of memory cells MC. The redundancy word lines RWL0-RWLz may be word lines for replacing defective word lines of the word lines WL0-WLx.

The memory bank BK0 may activate a word line WL corresponding to a control address ADD0 when a bank active signal BACT0 is activated. Based on information RR, however, the memory bank BK0 may activate a redundancy word line RWL corresponding to the control address ADD0 when the bank active signal BACT0 is activated.

The command decoder 510 may generate a mode setting command SET, the refresh command CREF, an active command ACT, and a precharge command PRE by decoding command signals CMDs. The command decoder 510 may activate one of the commands SET, CREF, ACT, and PRE corresponding to a combination of the command signals CMDs.

The setting circuit 520 may set an operating mode of the memory device based on a combination of the address signals ADDs when the mode setting command SET is activated. More specifically, the setting circuit 520 may set an advanced refresh (AR) mode or a piled refresh mode in the memory device. The setting circuit 520 may activate a first mode signal DREF if the AR mode has been set in the memory device and may deactivate the first mode signal DREF if not. Furthermore, the setting circuit 520 may activate a second mode signal 2PILED if a 2-piled mode has been set in the memory device and may deactivate the second mode signal 2PILED if a 4-piled mode has been set in the memory device.

The additional setting information generation unit 530 may generate additional setting information 3XF, HRMSEL, TR1, and RR for additionally controlling the operation of the memory device in addition to the modes set by the setting circuit 520. The additional setting information generation unit 530 may generate the information 3XF for setting the number of times that the memory banks BK0-BK3 are refreshed (hereinafter referred to as a "the number of refresh times") to three or more times at the one input of the refresh command CREF. The additional setting information generation unit 530 may generate the information TR1 and RR on which the TR1 and RR operations are performed, respectively. The additional setting information generation unit 530 may generate the information HRMSEL for determining the refresh command CREF by which an actual advanced refresh operation is performed based on an AR mode (e.g., a 1.25×, 1.5×, 1.75×, or 2× AR mode). The 2× AR mode is described below as an example.

The additional setting information generation unit 530 may activate the information 3XF if an additional AR mode has been set and may deactivate the information 3XF if not. Furthermore, the additional setting information generation unit 530 may activate the information HRMSEL to perform two or more refresh operations at the input of the refresh command CREF and may deactivate the information HRMSEL to perform only one refresh operation at the input of the refresh command CREF, depending on what AR mode has been set. Table 1 shows whether the information HRMSEL is activated or deactivated in the order of the refresh command CREF applied in 1.25×, 1.5×, 1.75×, and 2× AR modes.

TABLE 1

|  | 2X AR | 1.75X AR | 1.5X AR | 1.25X AR |
| --- | --- | --- | --- | --- |
| Once | Activated | Deactivated | Deactivated | Deactivated |
| Twice | Activated | Activated | Deactivated | Deactivated |
| Three times | Activated | Activated | Activated | Deactivated |
| Four times | Activated | Activated | Activated | Activated |

The additional AR mode and the AR mode may be set in response to signals received from the outside of the memory device when the memory device is reset or operates. Also those modes may be set based on information stored in a fuse in a process for manufacturing the memory device.

The additional setting information generation unit 530 may activate the information TR1 whenever the refresh command CREF is inputted a specific number of times (e.g., 4 times). Furthermore, the additional information generation unit 530 may activate the information RR whenever the refresh command CREF is inputted a specific number of times (e.g., 8 times) if a specific ratio (e.g., 50%) or more of the redundancy word lines have been used to replace the word lines. The memory device may perform the TR1 operation when the information TR1 is activated, but may perform the RR operation although the information TR1 is activated when the information RR is activated.

For reference, the additional setting information generation unit 530 may update the additional setting information 3XF, HRMSEL, TR1, and RR whenever the refresh command CREF is applied.

The control address generation unit 540 may generate control addresses ADD0-ADD3 for selecting word lines on which an active operation, the NR operation, the TR1 operation, and the RR operation are performed. The control addresses ADD0-ADD3 may correspond to the respective memory banks BK0-BK3. The configuration and operation of the control address generation unit 540 is described in detail later with reference to FIG. 9.

If the AR mode has not been set, when the refresh command CREF is applied, the refresh control unit 550 may divide the plurality of memory banks BK0-BK3 into groups determined according to the piled mode and may refresh the groups once at different times. If the AR mode has not been set and the 2-piled mode has been set, when the refresh command CREF is applied, the refresh control unit 550 may control the groups BK0 and BK1 and the groups BK2 and BK3 to be once refreshed at different times. If the AR mode has not been set and the 4-piled mode has been set, when the refresh command CREF is applied, the refresh control unit 550 may control the group BK0, the group BK1, the group BK2, and the group BK3 to be once refreshed at different times.

If the AR mode has been set, the refresh control unit 550 may divide the plurality of memory banks BK0-BK3 into groups determined based on the piled mode and the additional setting information 3XF, TR1, RR, and HRMSEL and may refresh the groups two times or three or more times at different times.

More specifically, if the AR mode has been set and the number of refresh times is two, when the refresh command CREF is once applied, the refresh control unit 550 may control the memory banks to perform the 4-piled refresh operation. If the AR mode has been set and the number of refresh times is three, when the refresh command CREF is once applied, the refresh control unit 550 may control the memory banks to perform the 2-piled refresh operation. That is, if the number of refresh times is three, the refresh control unit 550 may control the memory banks BK0-BK3 to be divided into a reduced number of groups in the piled refresh operation compared to a case where the number of refresh times is two. The refresh control unit 550 may activate an additional advanced signal 3XE if the number of refresh times is three and may deactivate the additional advanced signal 3XE if the number of refresh times is not three.

A case where the AR mode is set and the number of refresh times is two may not correspond to an additional AR mode, or may correspond to the TR1 operation in the additional AR mode. A case where the AR mode is set and the number of refresh times is three may correspond to other operations (e.g., the NR or RR operation) than the TR1 operation in the additional AR mode.

The refresh control unit 550 may activate a refresh signal REF in order to control the refresh operation of each of the memory banks BK0-Bk3. When the refresh command REF is applied, the refresh control unit 550 may activate the refresh signal REF more than once based on the number of refresh times. Furthermore, the refresh control unit 550 may generate a plurality of bank refresh signals BK0_REF-BK_REF3 corresponding to the respective memory banks BK0-Bk3. Each of the memory banks BK0-BK3 may perform a refresh operation for a specific time from a point of time at which the corresponding one of the bank refresh signals BK0_REF-BK_REF3 is activated.

When the active command ACT is applied or the refresh command CREF (i.e. the bank refresh signals BK0_REF-BK_REF3) is applied, the bank active control unit 560 may control the active operation of a memory bank. The active operation of the memory banks BK0-BK3 may be indicative of an operation for activating and precharging word lines selected by the control addresses ADD0-ADD3.

The bank active control unit 560 may generate bank active signals BACT0-BACT3 corresponding to the respective memory banks BK0-BK3. When the active command ACT is applied, the bank active control unit 560 may activate a bank active signal corresponding to a bank address BADD. When the precharge command PRE is applied, the bank active control unit 560 may deactivate an activated bank active signal. The bank active control unit 560 may activate the bank active signals BACT0-BACT3 in a specific section in response to the bank refresh signals BK0_REF-BK3_REF, respectively. The bank active signals BACT0-BACT3 may be activated at the same time as the active section of a word line selected in a memory bank.

In the memory device, a refresh cycle tRFC may be defined as a fixed value according to the specification. Accordingly, to drive the memory device while flexibly changing the number of refresh times and the piled mode, the timing may be adjusted when the number of refresh times or the piled mode is changed.

Figure 7A:
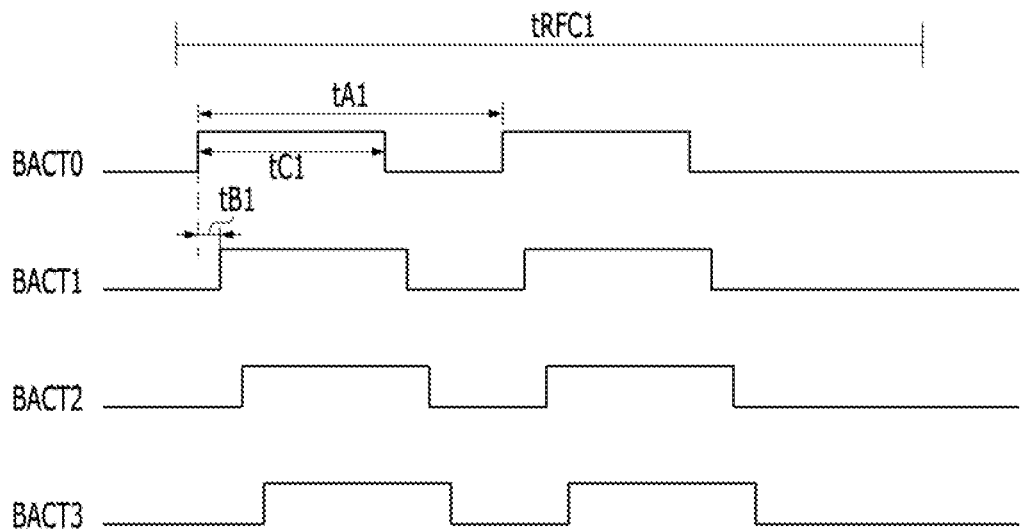
FIGS. 7A to 7B are diagrams illustrating the operation of a refresh control unit and a bank active control unit of the memory device of FIG. 5.
Figure 7B:
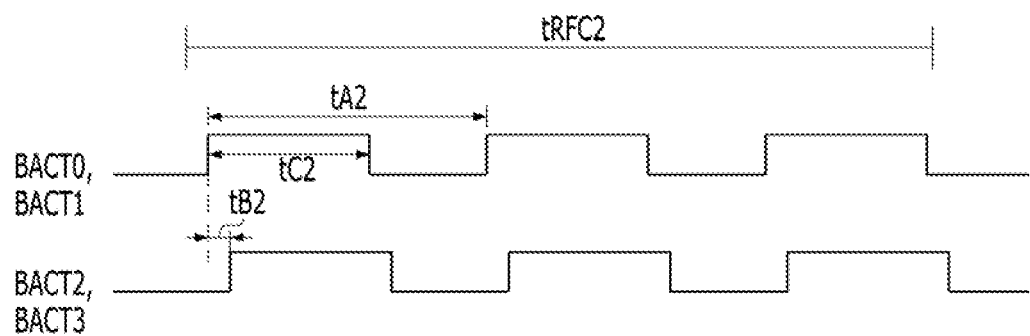

FIGS. 7A and 7B are diagrams illustrating the operation of the refresh control unit 550 and the bank active control unit 560 of FIG. 5.

FIG. 7A shows the waveforms of the bank active signals BACT0-BACT3 when a refresh operation is performed if the number of refresh times is two in the 4-piled mode (hereinafter referred to as a first case).

Referring to FIG. 7a, in the first case, during a refresh cycle tRFC1, in each of the memory banks BK0-BK3, a word line may be twice active-precharged, and word lines of the memory banks BK0-BK3 may be active-precharged in the order named. At this time, each word line may be refreshed at an interval tA1, and the memory banks BK0-BK3 may be refreshed with an interval tB1 therebetween. Each word line may be activated during a period tC1.

FIG. 7B shows the waveforms of the bank active signals BACT0-BACT3 when a refresh operation is performed if the number of refresh times is three in the 2-piled mode (hereinafter referred to as a second case).

In the second case, during a refresh cycle tRFC2, in each of the memory banks BK0-BK3, a word line may be active-precharged three times, and word lines of the memory banks BK0/BK1 and BK2/BK3 may be active-precharged in the order named. At this time, each word line may be refreshed at an interval tA2, and the memory banks BK0/BK1 and BK2/BK3 may be refreshed with an interval tB2 therebetween. Each word line may be activated during a period tC2. In this case, the refresh control unit 550 and the bank active control unit 560 may adjust times tA2, tB2, and tC2 shorter than those tA1, tB1, and tC1, respectively (tA2=tA1−a, tB2=tB1−b, and tC2=tC1−c, a, b, c are set time values).

That is, in the second case, the refresh control unit 550 may control each of the memory banks BK0-BK3 to be refreshed at a shorter interval, compared to the first case. Furthermore, in the second case, the refresh control unit 550 may control the memory banks belonging to different groups to be refreshed with a shorter interval therebetween, compared to the first case. Finally, in the second case (i.e., an additional advanced signal 3XE is activated), the bank active control unit 560 may control the active section of the word line (or the active section of the memory bank) so that the active section is shorter than that of the first case (i.e., the additional advanced signal 3XE is deactivated). The reason why specific timing is controlled as described is that the refresh cycles tRFC1 and tRFC2 need to be the same even when a different number of refresh times is employed.

For reference, the reason why the number of refresh times is two when the TR1 operation is performed is that the TR1 operation is an operation for refreshing the two word lines WLk−1 and WLk+1 adjacent to the word line WLk corresponding to a stored address (refer to FIG. 5A).

FIGS. 8A to 8D are diagrams for illustrating the operation of the memory device of FIG. 5. Hereinafter, the refresh command CREF is written in order of its application and indicated by CREF1-CREF8. FIGS. 8a to 8D describe as an example that the information TR1 is activated when the refresh command CREF is applied 4 times and the information RR is activated when the refresh command CREF is applied 8 times.

Figure 8A:
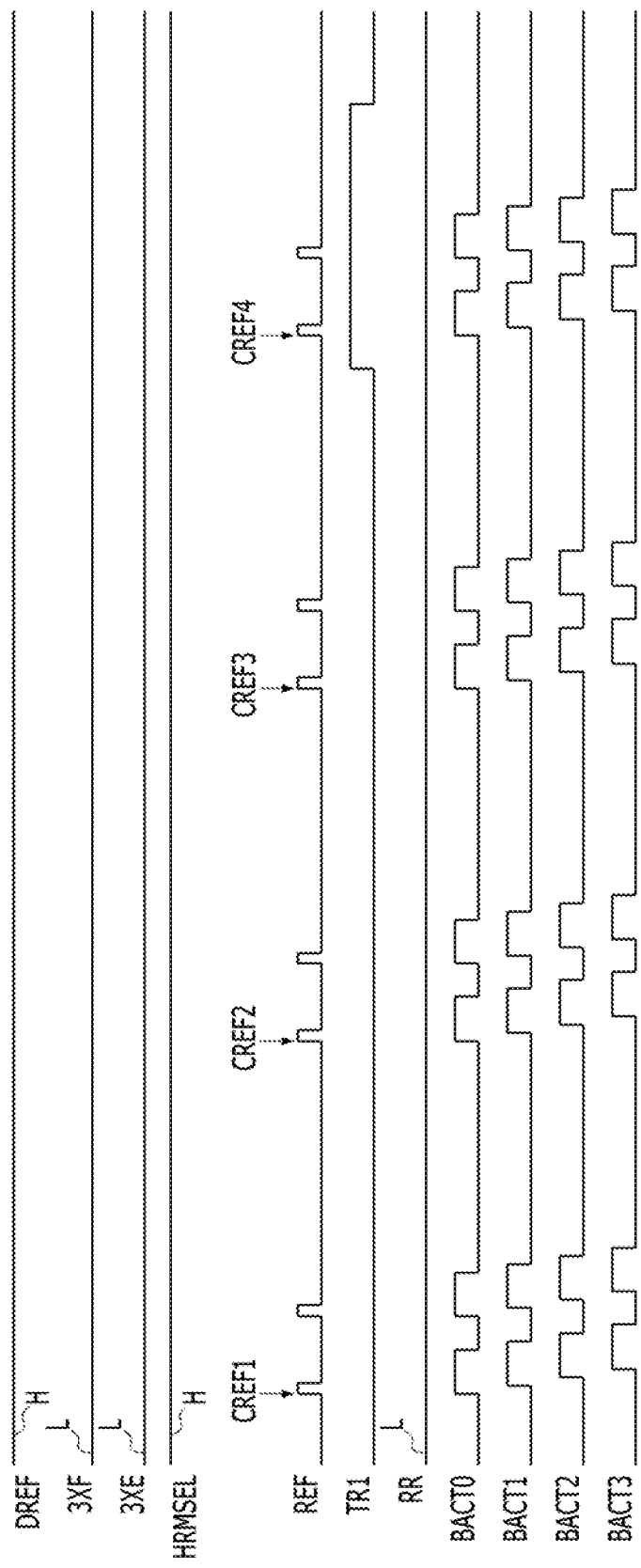
FIGS. 8A to 8D are diagrams illustrating the operation of the memory device of FIG. 5, according to an embodiment of the present invention.

FIG. 8A shows the refresh operation of the memory device if the AR mode and the TR1 operation have been set. In FIG. 8A, the RR operation may have not been set because the redundancy word lines are used less than 50%.

The first mode signal DREF and the information HRM-SEL may be activated (H) because the AR mode has been set, and the additional setting information 3XF and the additional advanced signal 3XE may be deactivated (L) because an additional AR operation has not been set.

When the first to the third refresh commands CREF1-CREF3 are applied, the NR operation may be performed. The refresh signal REF may be twice activated, and each of the memory banks may be twice refreshed. When the fourth refresh command CREF4 is applied, the TR1 operation may be performed because the additional setting information TR1 is activated, and each of the memory banks may be twice refreshed because the refresh signal REF is twice activated. Thereafter, the aforementioned operation may be repeated.

Figure 8B:
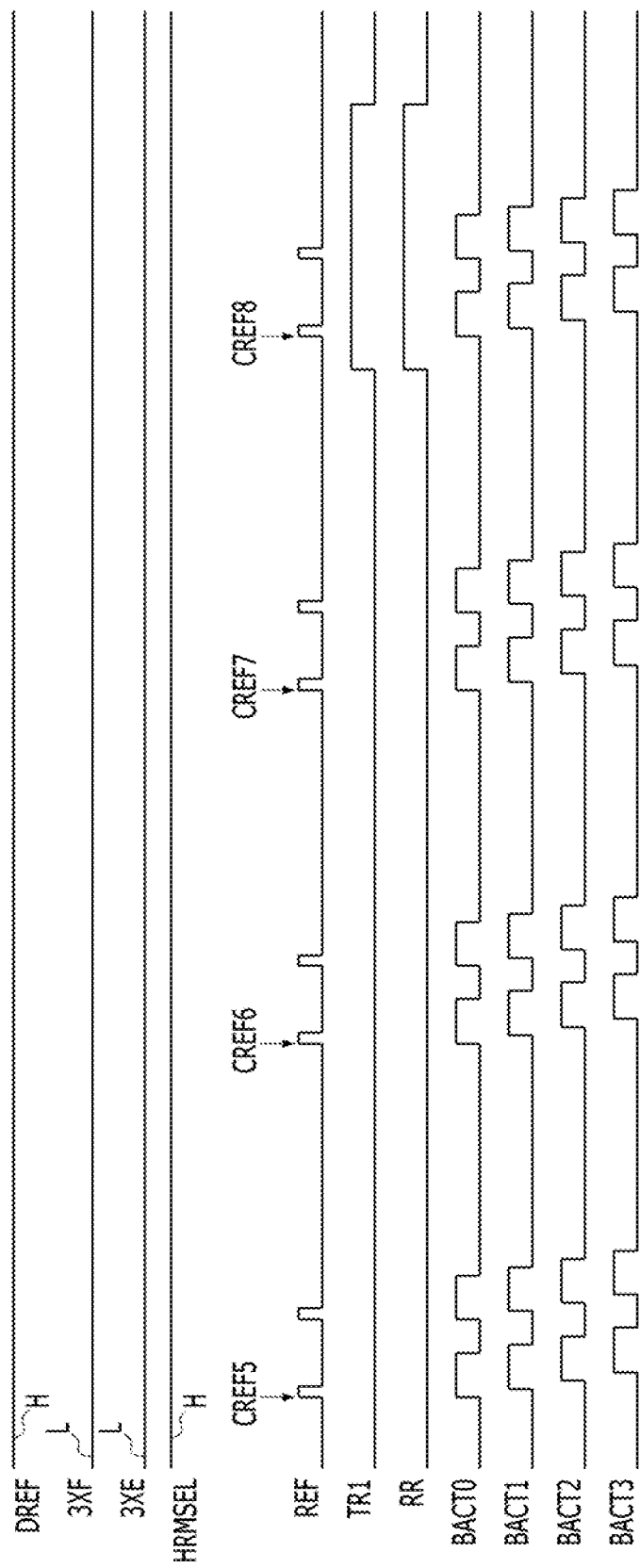

FIG. 8B shows the refresh operation of the memory device if the AR mode, the TR1 operation, and the RR operation have been set. In FIG. 8B, the RR operation may have been set because the redundancy word lines are used 50% or more.

When the first to the fourth refresh commands CREF1-CREF4 are applied, the memory device may operate the same as described above with reference to FIG. 8A (not shown in FIG. 8B). When the fifth to the seventh refresh commands CREF5-CREF7 are applied, the memory device may operate the same as when the first to the third refresh commands CREF1-CREF3 are applied in the description of FIG. 8A.

When the eighth refresh command CREF8 is applied, the RR operation may be performed because the additional setting information TR1 and RR are activated, and each of the memory banks may be twice refreshed because the refresh signal REF is twice activated. Thereafter, the aforementioned operation may be repeated.

Figure 8C:
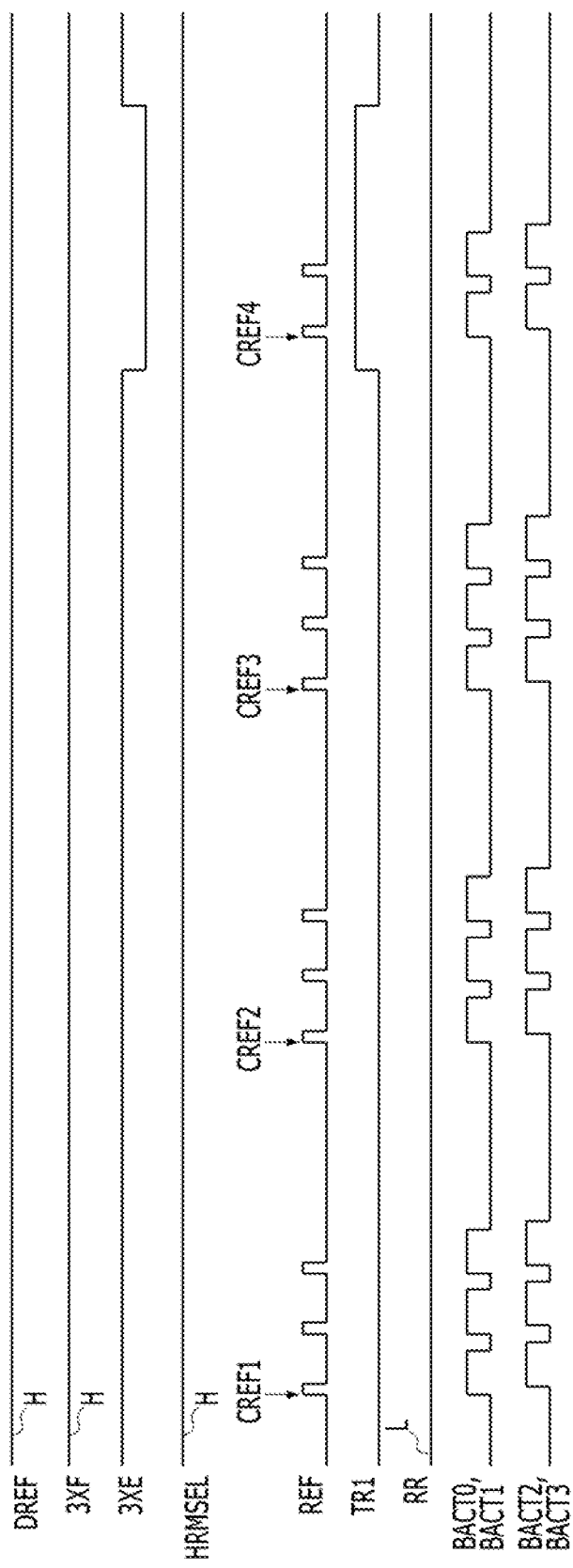

FIG. 8C shows the refresh operation of the memory device if the AR mode, the additional AR operation, and the TR1 operation have been set.

The first mode signal DREF and the information HRM-SEL may be activated (H) because the AR mode has been set, and the additional setting information 3XF may be activated (H) because the additional AR operation has been set.

When the first to the third refresh commands CREF1-CREF3 are applied, the NR operation may be performed, the refresh signal REF may be activated three times and each of the memory banks may be refreshed three times because the additional advanced signal 3XE is activated. When the fourth refresh command CREF4 is applied, the TR1 operation may be performed because the additional setting information TR1 is activated, the refresh signal REF may be twice activated and each of the memory banks may be twice refreshed because the additional advanced signal 3XE is deactivated. The aforementioned operation may be repeated.

Figure 8D:
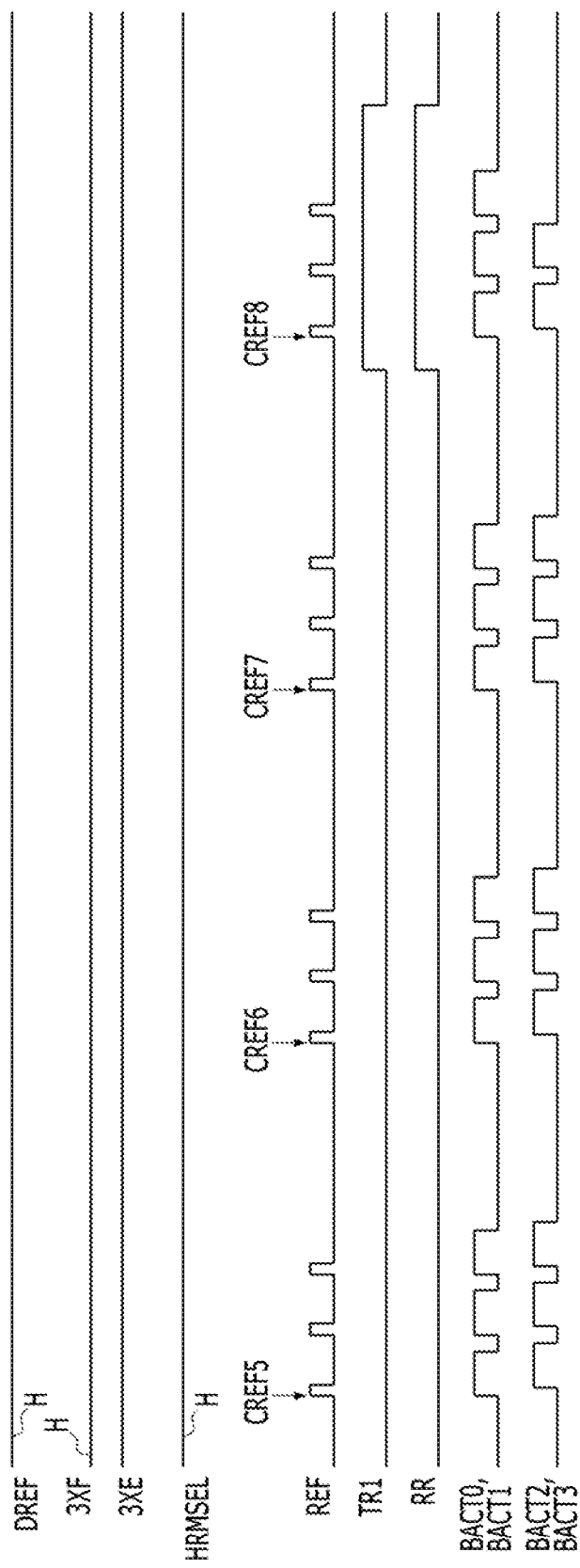

FIG. 8D shows the refresh operation of the memory device when the AR mode, the additional AR operation, the TR1 operation, and the RR operation have been set.

When the first to the fourth refresh commands CREF1-CREF4 are applied, the memory device may operate the same as described above with reference to FIG. 8C (not shown in FIG. 8D). When the fifth to the seventh refresh commands CREF5-CREF7 are applied, the memory device may operate the same as when the first to the third refresh commands CREF1-CREF3 are applied in the description of FIG. 8C.

When the eighth refresh command CREF8 is applied, the RR operation may be performed because the additional setting information TR1 and RR are activated, and the refresh signal REF may be activated three times and each of the memory banks may be refreshed three times because the additional advanced signal 3XE is activated. Thereafter, the aforementioned operation may be repeated.

For reference, although not shown in FIGS. 8A to 8D, as described above with reference to FIGS. 7A and 7B, a refresh interval of each of memory banks, a refresh interval between different groups of memory banks, and an activation section of word lines may be differently controlled, depending on the number of refresh times (i.e., two or three). The above description may be made as an example in which the number of refresh times is two or three, and the piled refresh mode is the 2-piled refresh mode or the 4-piled refresh mode, and as an example in which the TR1 operation is performed when the refresh command is inputted four times, and the RR operation is performed when the refresh command is inputted eight times. However, an embodiment of the present invention may not be limited thereto.

As described above with reference to FIGS. 5 to 8D, the memory device of FIG. 5 may prevent data from being lost due to various factors by covering various refresh operations in such a way as to flexibly change the number of refresh times and the piled mode and control corresponding specific timing.

Figure 9:
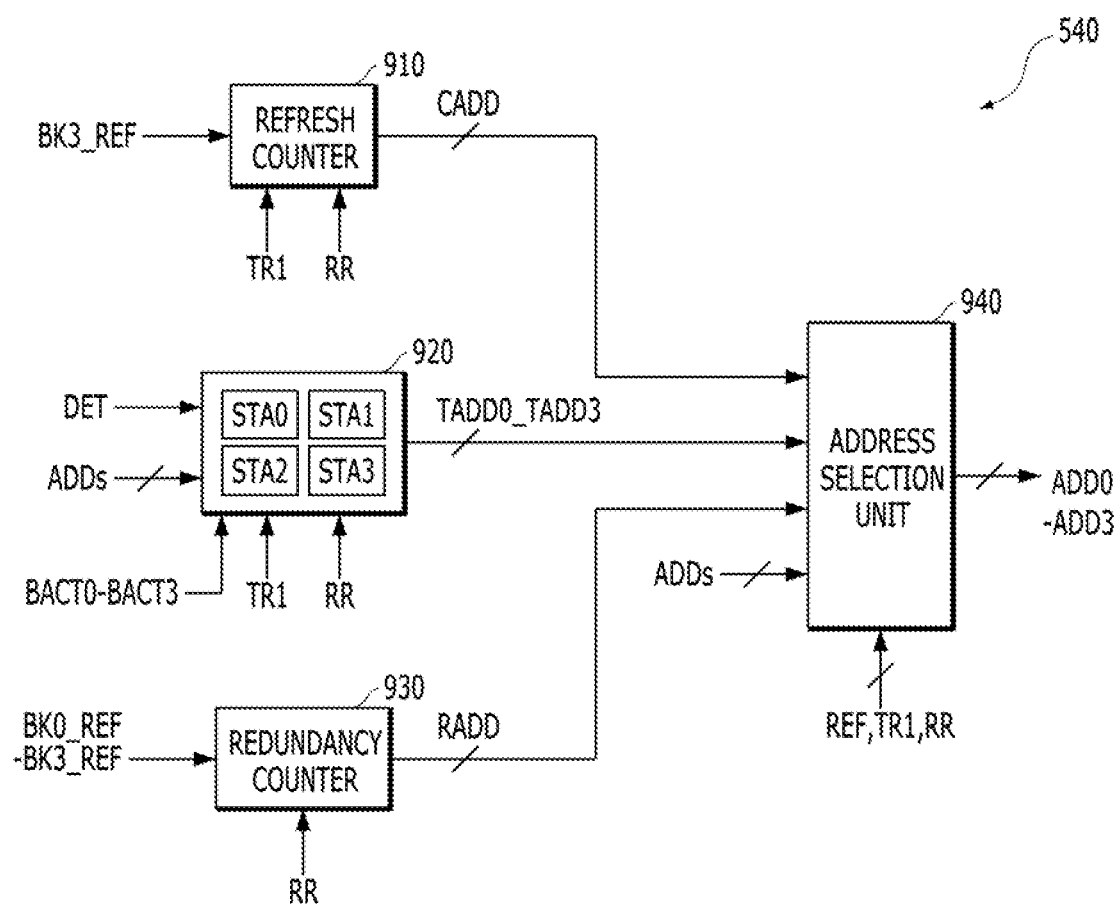
FIG. 9 is a diagram showing a configuration of a control address generation unit of the memory device of FIG. 5.

FIG. 9 is a diagram showing the configuration of the control address generation unit 540 of FIG. 5.

Referring to FIG. 9, the control address generation unit 540 may include a refresh counter 910, a target address generation unit 920, a redundancy counter 930, and an address selection unit 940.

The refresh counter 910 may perform counting in response to a bank refresh signal BK3_REF and generate a counting address CADD. The refresh counter 910 may increase the value of the counting address CADD by 1 through counting. To increase the value of the counting address CADD by 1 may mean that if a k-th word line has been selected this time, the counting address CADD is changed so that a (k+1)-th word line is selected next time. When the information TR1 or RR is activated, the refresh counter 910 may maintain the value of the counting address CADD without performing counting.

When the information TR1 is activated and the information RR is deactivated, the target address generation unit 920 may generate target addresses TADD0-TADD3 used in the TR1 operation. The target address generation unit 920 may include a plurality of address storage units STA0-STA3. The number of address storage units STA0-STA3 corresponds to the number of the memory banks BK0-BK3, and may store the address of a word line whose number of active times, active frequency, or active time is a specific reference or more in a corresponding memory bank. The plurality of address storage units STA0-STA3 may store input addresses ADDs when a detection signal DET is activated.

When the bank refresh signals BK0_REF-BK3_REF are activated first and second in the state in which the information TR1 has been activated, the target address generation unit 920 may generate first and second ones of the target addresses TADD0-TADD3 by adding or subtracting a specific value to or from addresses stored in the address storage units STA0-STA3. Table 2 shows output addresses and stored addresses in the address storage units STA0-STA3.

TABLE 2

| ADDRESS STORAGE UNIT | STA0 | STA1 | STA2 | STA3 |
|---|---|---|---|---|
| Word line corresponding to stored address (value of stored address) | WLk0 (k0) | WLk1 (k1) | WLk2 (k2) | WLk3 (k3) |
| CASE1: first target word line (value of target address) | WLk0-1 (k0-1) | WLk1-1 (k1-1) | WLk2-1 (k2-1) | WLk3-1 (k3-1) |
| CASE1: second target word line (value of target address) | WLk0+1 (k0+1) | WLk1+1 (k1+1) | WLk2+1 (k2+1) | WLk34-1 (k3+1) |
| CASE2: first target word line (value of target address) | WLk0+1 (k0+1) | WLk1+1 (k1+1) | WLk2+1 (k2+1) | WLk3+1 (k3+1) |
| CASE2: second target word line (value of target address) | WLk0-1 (k0-1) | WLk1-1 (k1-1) | WLk2-1 (k2-1) | WLk3-1 (k3-1) |

The target address generation unit 920 is not limited to the aforementioned example, but may store the address of a specific word line satisfying a condition in which the specific word line has an influence on the data of adjacent word lines due to an active operation and generate the addresses of the adjacent word lines as the target addresses using the address of the specific word line.

The redundancy counter 930 may perform counting when the bank refresh signal BK3_REF are activated and the information RR is activated, and may generate a redundancy address RADD. The redundancy counter 930 may increase the value of the counting address RADD by 1 through counting. Increasing the value of the redundancy address RADD by 1 may mean that if a k-th redundancy word line has been selected this time, the redundancy address RADD is changed so that a (k+1)-th redundancy word line is selected next time.

The address selection unit 940 may select at least one of the input address ADDs, the counting address CADD, the target addresses TADD0-TADD3, and the redundancy address RADD and output them as the control addresses ADD0-ADD3. When all of the pieces of information REF, TR1, and RR are deactivated, the address selection unit 940 may select the input address ADDs and output them as the control addresses ADD0-ADD3.

When the information REF is activated and the information TR1 and RR are deactivated, the address selection unit 940 may select the counting address CADD and output it as the control addresses ADD0-ADD3. When the information REF and TR1 are activated and the information RR is deactivated, the address selection unit 940 may select the target addresses TADD0-TADD3 and output them as the respective control addresses ADD0-ADD3 (i.e., TADD0→ADD0, TADD1→ADD1, TADD2→ADD2, and TADD3→ADD3). When the information REF and RR are activated, the address selection unit 940 may select the redundancy address RADD and output it as the control addresses ADD0-ADD3.

Accordingly, when an active operation is performed, a word line may be selected by the input address ADDs. When the NR operation is performed, a word line may be selected by the counting address CADD. When the TR1 operation is performed, a word line may be selected by the target addresses TADD0-TADD3 corresponding to the respective memory banks. When the RR operation is performed, a redundancy word line may be selected by the redundancy address RADD.

Figure 10:
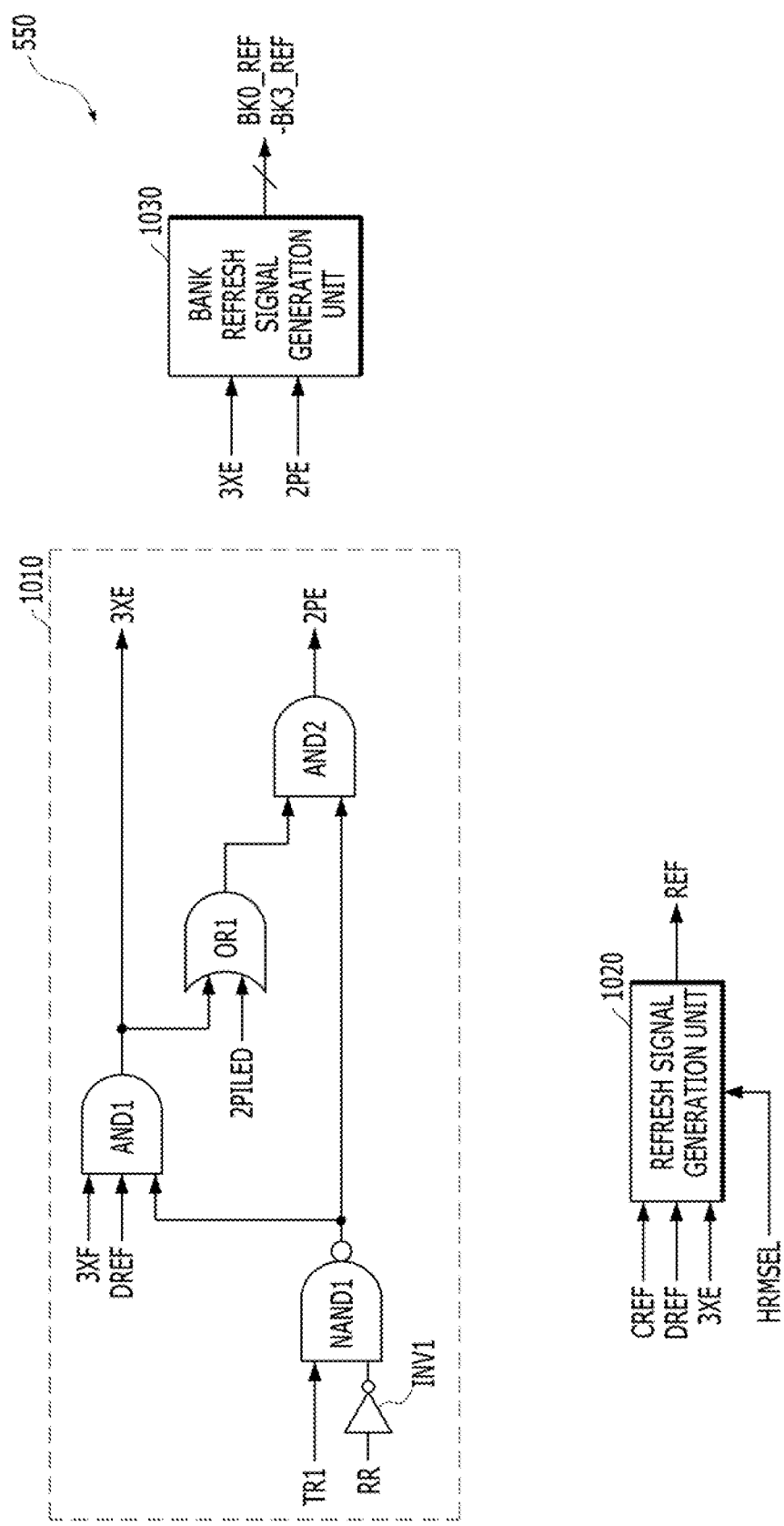
FIG. 10 is a diagram showing a configuration of a refresh control unit of the memory device of FIG. 5.

FIG. 10 is a diagram showing a configuration of the refresh control unit 550 of FIG. 5.

Referring to FIG. 10, the refresh control unit 550 may include a control signal generation unit 1010, a refresh signal generation unit 1020, and a bank refresh signal generation unit 1030.

The control signal generation unit 1010 may generate an additional advanced signal 3XE and a piled signal 2PE based on the first mode signal DREF, the second mode signal 2PILED, and the additional setting information 3XF, TR1, and RR. Table 3 shows whether the additional advanced signal 3XE is activated or not depending on the activation of the information TR1 and the information RR if both the information 3XF and the first mode signal DREF are activated.

TABLE 3

| TR1 | RR | 3XE |
|---|---|---|
| Deactivated | Deactivated | Activated |
| Deactivated | Activated | Activated |
| Activated | Deactivated | Deactivated |
| Activated | Activated | Activated |

In addition, when one or more of the information 3XF and the first mode signal DREF are deactivated, the additional advanced signal 3XE may be deactivated.

When the information TR1 is activated and the information RR is deactivated, the control signal generation unit 1010 may deactivate the piled signal 2PE regardless of whether the second mode signal 2PILED and the additional advanced signal 3XE have been activated. In other cases, when the second mode signal 2PILED or the additional advanced signal 3XE is activated, the control signal generation unit 1010 may activate the piled signal 2PE. For such an operation, the control signal generation unit 1010 may include logic gates AND1, AND2, NAND1, INV1, and OR1.

The number of refresh times may be more than 3 if the additional advanced signal 3XE has been activated, and the number of refresh times may be two or less if the additional advanced signal 3XE has been deactivated. A 2-piled refresh operation may be performed if the piled signal 2PE has been activated, and a 4-piled refresh operation may be performed if the piled signal 2PE has been deactivated.

The refresh signal generation unit 1020 may activate the refresh signal REF in a number and interval determined by the first mode signal DREF and the additional advanced signal 3XE when the refresh command CREF is applied. If the AR mode has not been set (DREF deactivated), the refresh signal generation unit 1020 may activate the refresh signal REF once when the refresh command CREF is inputted. If the AR mode has been set (DREF activated) and the additional advanced signal 3XE is deactivated, the refresh signal generation unit 1020 may activate the refresh signal REF twice when the refresh command CREF is inputted. If the AR mode has been set and the additional advanced signal 3XE is activated, the refresh signal generation unit 1020 may activate the refresh signal REF three times when the refresh command CREF is inputted.

If the AR mode has been set, the refresh signal generation unit 1020 may control the active interval of the refresh signal REF depending on whether the additional advanced signal 3XE is activated or not. In this case, when the additional advanced signal 3XE is activated, the refresh signal generation unit 1020 may control the active interval of the refresh signal REF shorter than when the additional advanced signal 3XE is deactivated.

The bank refresh signal generation unit 1030 generates a plurality of the bank refresh signals BK0_REF-BK3_REF. The bank refresh signal generation unit 1030 may divide the plurality of bank refresh signals BK0_REF-BK3_REF into the number of groups determined by whether the piled signal 2PE is activated and activate the groups at an interval determined by whether the piled signal 2PE is activated.

When the piled signal 2PE is deactivated, the bank refresh signal generation unit 1030 may divide the plurality of bank refresh signals BK0_REF-BK3_REF into four groups and sequentially activate the four groups. When the additional advanced signal 3XE is activated, the bank refresh signal generation unit 1030 may divide the plurality of bank refresh signals BK0_REF-BK3_REF into two groups and sequentially activate the two groups. In this case, the bank refresh signal generation unit 1030 may control the active interval of the two groups shorter than that of different groups when the additional advanced signal 3XE is deactivated.

Figure 11:
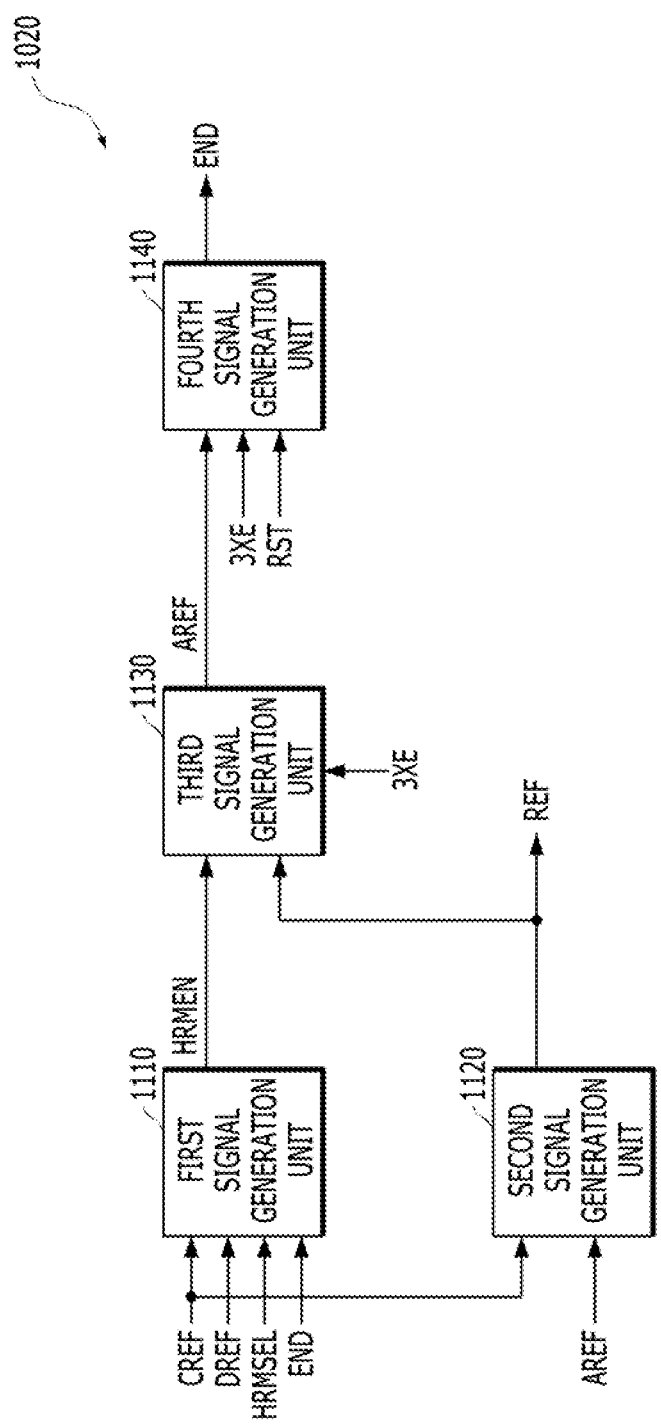
FIG. 11 is a diagram showing a configuration of a refresh signal generation unit of FIG. 10.

FIG. 11 is a diagram showing a configuration of the refresh signal generation unit 1020 of FIG. 10.

Referring to FIG. 11, the refresh signal generation unit 1020 may include first to fourth signal generation units 1110-1140.

The first signal generation unit 1110 may activate a signal HRMEN if both the first mode signal DREF and the information HRMSEL have been activated when the refresh command CREF is applied, and may deactivate the signal HRMEN if one or more of the first mode signal DREF and the information HRMSEL have been deactivated when the refresh command CREF is applied. The first signal generation unit 1110 may reset (or deactivate) the signal HRMEN when an end signal END is activated.

The second signal generation unit 1120 may activate the refresh signal REF when the refresh command CREF is applied or an additional refresh signal AREF is activated.

The third signal generation unit 1130 may activate the additional refresh signal AREF after a first time from a point of time at which the refresh signal REF is deactivated when the signal HRMEN is activated, and may not activate the additional refresh signal AREF when the signal HRMEN is deactivated. In this case, the first time when the additional advanced signal 3XE is activated may be controlled so that it is shorter than that when the additional advanced signal 3XE is deactivated.

The fourth signal generation unit 1140 generates the end signal END. In this case, the fourth signal generation unit 1140 may activate the end signal END after the additional refresh signal AREF is once activated if the additional advanced signal 3XE has been deactivated, and may activate the end signal END after the additional refresh signal AREF is twice activated if the additional advanced signal 3XE has been activated. When a reset signal RST is activated, the fourth signal generation unit 1140 may be reset (e.g., the end signal END may be deactivated, and the activation number counting value of the additional refresh signal AREF may be reset to 0).

Figure 12A:
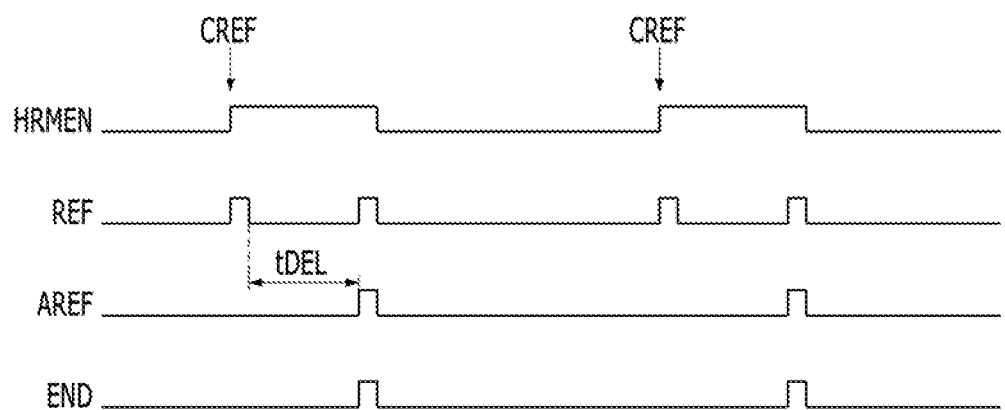
FIGS. 12A to 12B are diagrams illustrating the operation of the refresh signal generation unit of FIG. 11.
Figure 12B:
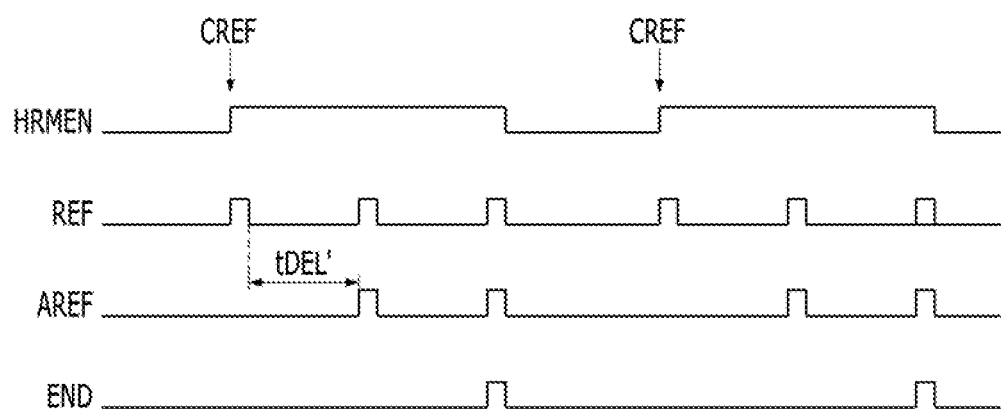

FIGS. 12A and 12B are diagrams for illustrating the operation of the refresh signal generation unit 1120 of FIG. 11. An example in which the refresh signal REF is activated twice or three times in response to the refresh command CREF is described below. Accordingly, it is described as an example that the first mode signal DREF and the information HRMSEL have always been activated in the illustrated sections.

FIG. 12A shows that the refresh signal generation unit 1120 activates the refresh signal REF twice when the refresh command CREF is applied.

Referring to FIG. 12A, when the refresh command CREF is applied, the refresh signal REF may be first activated. Furthermore, the signal HRMEN is activated because the first mode signal DREF and the information HRMSEL have been activated. Since the signal HRMEN has been activated, the additional refresh signal AREF may be activated after a specific time tDEL from a point of time at which the refresh signal REF is deactivated. When the additional refresh signal AREF is activated, the refresh signal REF may be second activated. Furthermore, since the additional refresh signal AREF has been once counted, the end signal END may be activated and the signal HRMEN may be deactivated.

FIG. 12B shows that the refresh signal generation unit 1120 activates the refresh signal REF three times when the refresh command CREF is applied.

Referring to FIG. 12B, when the refresh command CREF is applied, the refresh signal REF may be first activated. Furthermore, the signal HRMEN is activated because the first mode signal DREF and the information HRMSEL have been activated. Since the signal HRMEN has been activated, the additional refresh signal AREF may be first activated after a specific time tDEL' from a point of time at which the refresh signal REF is deactivated. When the additional refresh signal AREF is first activated, the refresh signal REF may be second activated. The additional refresh signal AREF may be second activated after the specific time tDEL' from a point of time at which the second activated refresh signal REF is deactivated. When the additional refresh signal AREF is second activated, the refresh signal REF may be third activated. Furthermore, since the additional refresh signal AREF has been twice counted, the end signal END may be activated and the signal HRMEN may be deactivated.

In this case, in order to control the interval between the refresh operations, the specific times tDEL and tDEL' may be adjusted to have different values (tDEL<tDEL') depending on whether the additional advanced signal 3XE is activated or not. Furthermore, the number of refresh times may be adjusted by adjusting the number of times that the additional refresh signal AREF needs to be activated in order to activate the end signal END (i.e., the number of refresh times may be adjusted to be 3 or more). For example, if the additional refresh signal AREF needs to be activated k number of times in order to activate the end signal END, the number of refresh times may be (k+1).

Figure 13:
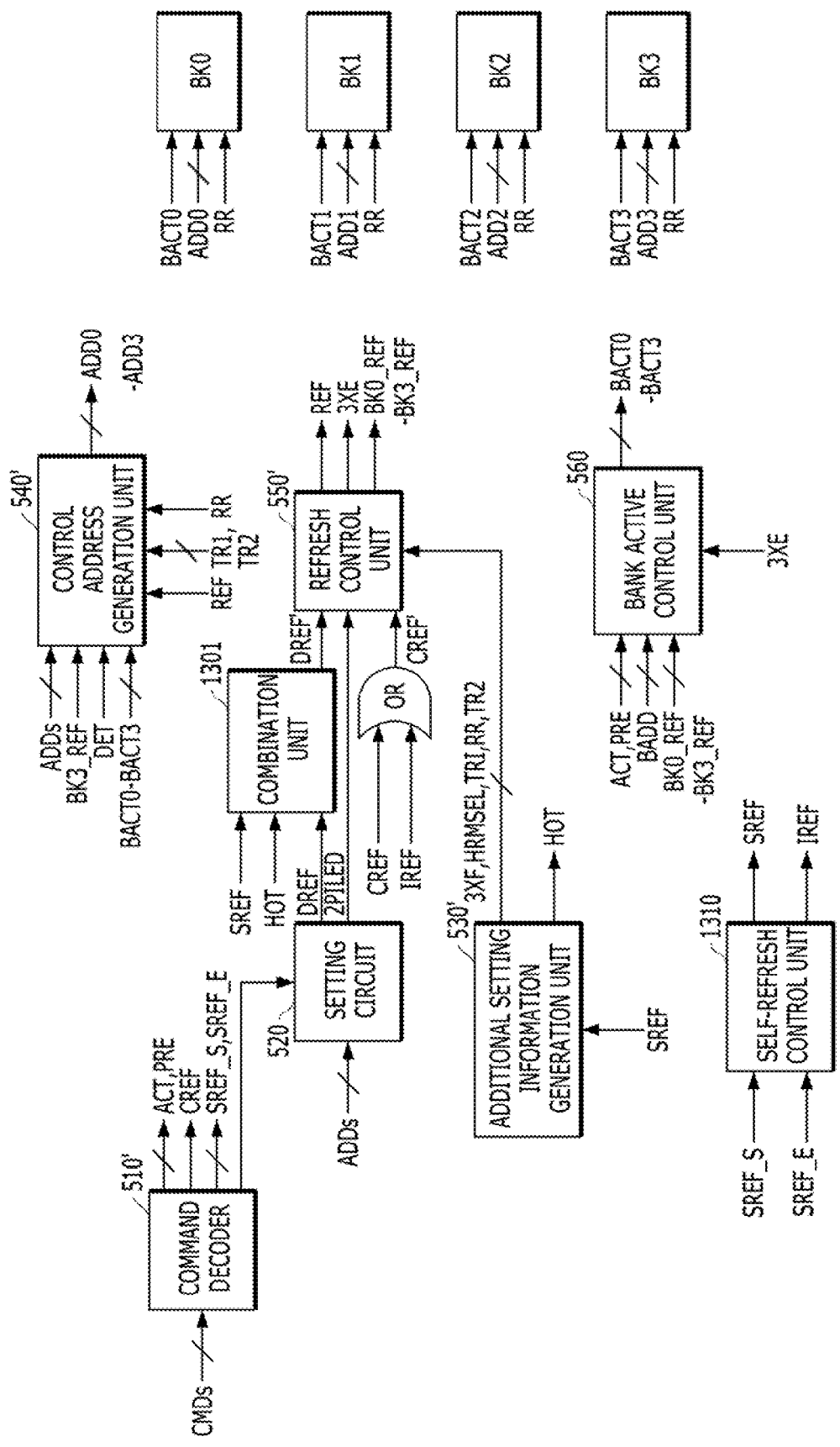
FIG. 13 is a diagram showing a memory device, according to another embodiment of the present invention.

FIG. 13 is a diagram illustrating a memory device 500' according to another embodiment of the present invention.

Referring to FIG. 13, the memory device may include the plurality of memory banks BK0-BK3, a command decoder 510', the setting circuit 520, an additional setting information generation unit 530', a control address generation unit 540', a refresh control unit 550', the bank active control unit 560, and a self-refresh control unit 1310.

The memory device 500' of FIG. 13 may adjust the number of refresh times using more pieces of setting information compared with the memory device 500 of FIG. 5. Furthermore, the memory device 500' of FIG. 13 may adjust the number of refresh times during a self-refresh operation.

The memory device 500' is described below based on the differences between the memory device 500' of FIG. 13 and the memory device 500 of FIG. 5.

The memory device 500' of FIG. 13 may control the number of refresh times and a piled refresh operation based on the TR2 operation and temperature information in addition to the AR mode, the piled refresh mode, the TR1 operation, and the RR operation.

The command decoder 510' may activate a self-refresh start command SREF_S and a self-refresh end command SREF_E based on a combination of the command signals CMDs in addition to the aforementioned commands SET, CREF, ACT, and PRE.

The additional setting information generation unit 530' may generate information TR2 to perform the TR2 operation and information HOT activated when a temperature of the memory device is higher than a specific reference temperature, in addition to the additional setting information 3XF, HRMSEL, TR1, and RR generated by the additional setting information generation unit 530 of FIG. 5. For example, the additional setting information generation unit 530' may activate the information TR2 when the refresh command CREF is activated 16 times, and may activate the information HOT when a temperature is higher than a reference temperature, e.g., of 85'C. For reference, the additional setting information generation unit 530' may update the additional setting information 3XF, HRMSEL, TR1, TR2, RR, and HOT whenever the refresh command CREF is applied. For reference, the reference temperature may vary depending on the circuit design of the memory device.

When the self-refresh signal SREF is activated, the additional setting information generation unit 530' may deactivate at least one of the information TR1 and the information RR so that at least one of the TR1 operation and the RR operation are not performed. The reason for this is that it is not necessary to perform the TR1 operation and the RR operation because an active operation is not performed in the section in which a self-refresh operation is performed.

The control address generation unit 540' may generate control addresses ADD0-ADD3 for selecting a word line on which an active operation, the NR operation, the TR1 operation, the TR2 operation and/or the RR operation is to be performed. The control addresses ADD0-ADD3 may correspond to the memory banks BK0-BK3, respectively. The configuration and operation of the control address generation unit 540' is described in detail later with reference to FIG. 14.

The refresh control unit 550' may perform control, i.e., activate the additional advanced signal 3XE, so that the number of refresh times becomes three if the AR mode has been set and the information HOT has been activated (i.e., a temperature is higher than 85° C.) in addition to the case described with reference to FIG. 5. In this case, when the self-refresh signal SREF is activated, the refresh control unit 550' may perform control so that the number of refresh times becomes two although the information HOT has been activated. The refresh control unit 550' may perform control so that a 4-piled refresh operation is performed (i.e., a piled signal 2PE is deactivated) if the number of refresh times is two and a 2-piled refresh operation is performed (i.e., the piled signal 2PE is activated) if the number of refresh times is three.

The refresh control unit 550' may receive a combined command CREF', that is, the results of the OR combination of the refresh command CREF and an internal refresh command IREF, instead of the refresh command CREF of FIG. 5, and may receive a third mode signal DREF' obtained by logically combining the first mode signal DREF, the self-refresh signal SREF, and the information HOT through a combination unit 1301 instead of the first mode signal DREF of FIG. 5. The combined command CREF' and the third mode signal DREF' may be employed for controlling a self-refresh operation not disclosed in the memory device 500 of FIG. 5. Table 4 shows whether the third mode signal DREF' is activated or not depending on a combination of the signals DREF, SREF, and HOT.

TABLE 4

| DREF | SREF | HOT | DREF' |
|---|---|---|---|
| Deactivated | Deactivated | Deactivated | Deactivated |
| Deactivated | Deactivated | Activated | Deactivated |
| Deactivated | Activated | Deactivated | Deactivated |
| Deactivated | Activated | Activated | Deactivated |
| Activated | Deactivated | Deactivated | Activated |
| Activated | Deactivated | Activated | Activated |
| Activated | Activated | Deactivated | Deactivated |
| Activated | Activated | Activated | Activated |

In accordance with Table 4, the refresh control unit 550' controls a refresh operation so that the number of refresh times becomes 1 when a self-refresh operation is performed, but may also control the refresh operation so that the number of refresh times becomes two if a temperature is higher than the reference temperature during a self-refresh operation.

The self-refresh control unit 1310 may activate the self-refresh signal SREF when the self-refresh start command SREF_S is applied, and may deactivate the self-refresh signal SREF when the self-refresh end command SREF_E is applied. The self-refresh control unit 1310 may generate the internal refresh command IREF activated at a specific interval in the section in which the self-refresh signal SREF has been activated. The self-refresh control unit 1310 may include an oscillator (not shown) configured to generate the internal refresh command IREF.

Figure 14:
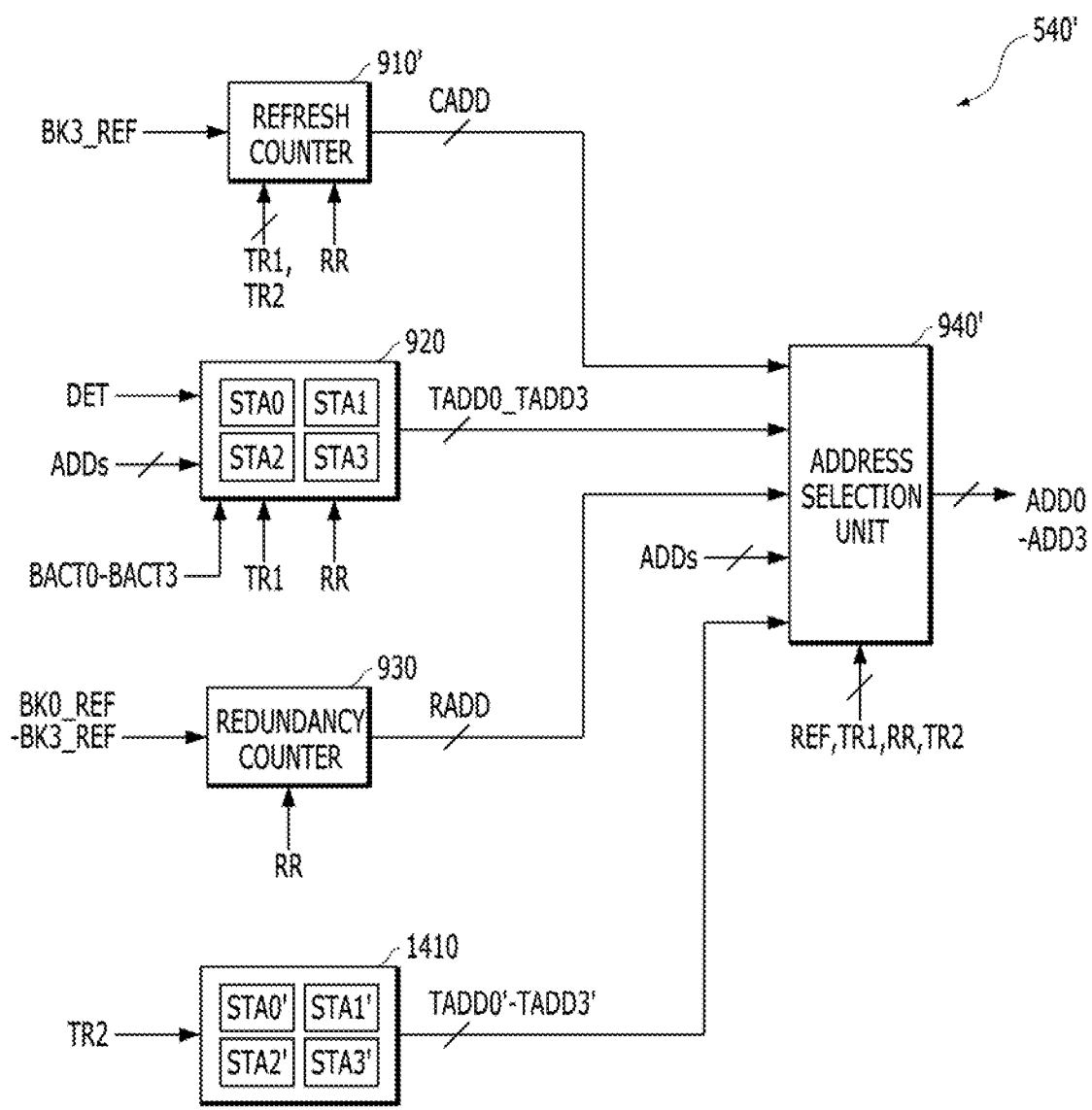
FIG. 14 is a diagram showing a configuration of a control address generation unit of the memory device of FIG. 13.

FIG. 14 is a diagram showing the configuration of the control address generation unit 540' of FIG. 13

Referring to FIG. 14, the control address generation unit 540' may include a refresh counter 910', the first target address generation unit 920, the redundancy counter 930, a second target address generation unit 1410, and an address selection unit 940.'

The refresh counter 910' may maintain the value of the counting address CADD without performing counting when the information TR1, TR2, and/or RR is activated.

The operation of the first target address generation unit 920 may be the same as that of the target address generation unit 920 of FIG. 9 (i.e., generates the first target addresses TADD0-TADD3). The second target address generation unit 1410 includes a plurality of second address storage units STA0'-STA3.' When the information TR2 is activated, the second target address generation unit 1410 may generate the second target addresses TADD0'-TADD0' having the same values as addresses stored in the second address storage units STA0'-STA3' and output them. The plurality of second address storage units STA0'-STA3' corresponds to one of the memory banks BK0-BK3 and may store the address of a weak word line in a corresponding memory bank.

When the refresh signal REF is activated and the information TR1, RR, and TR2 are deactivated, the address selection unit 940' may select the counting address CADD and output it as the control addresses ADD0-ADD3. When the refresh signal REF and the information TR1 are activated and the information RR and TR2 are deactivated, the address selection unit 940' may select the first target addresses TADD0-TADD3 and output them as the control addresses ADD0-ADD3, respectively (i.e., TADD0→ADD0, TADD1→ADD1, TADD2→ADD2, and TADD3→ADD3). When the refresh signal REF and the information RR are activated and the information TR2 is deactivated, the address selection unit 940' may select the redundancy address RADD and output it as the control addresses ADD0-ADD3. When the refresh signal REF and the information TR2 are activated, the address selection unit 940' may select the second target addresses TADD0'-TADD3' and output them as the control addresses ADD0-ADD3, respectively (TADD0'-ADD0, TADD1'→ADD1, TADD2'→ADD2, and TADD3'-ADD3).

Figure 15:
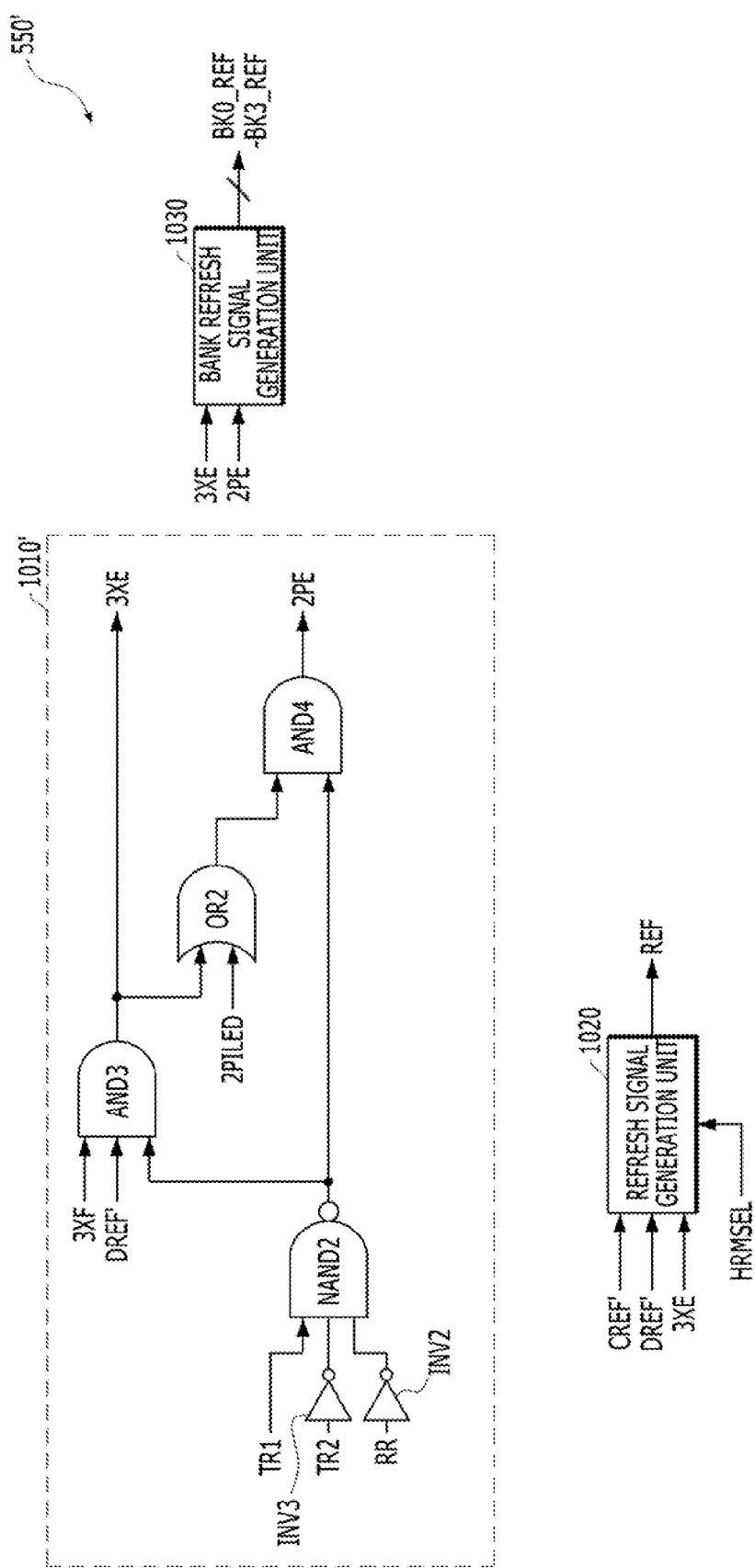
FIG. 15 is a diagram showing a configuration of a refresh control unit of the memory device of FIG. 13.

FIG. 15 is a diagram showing a configuration of the refresh control unit 550' of FIG. 13

Referring to FIG. 15, the refresh control unit 550' may include a control signal generation unit 1010', the refresh signal generation unit 1020, and the bank refresh signal generation unit 1030.

The control signal generation unit 1010' may generate the additional advanced signal 3XE and the piled signal 2PE based on the third mode signal DREF', the second mode signal 2PILED, and the additional setting information 3XF, TR1, TR2, and RR. Table 5 shows whether the additional advanced signal 3XE is activated or not depending on the activation of the information TR1, TR2 and RR when both the information 3XF and the third mode signal DREF' are activated.

TABLE 5

| TR1 | RR | TR2 | 3XE |
|---|---|---|---|
| Deactivated | Deactivated | Deactivated | Activated |
| Deactivated | Deactivated | Activated | Activated |
| Deactivated | Activated | Deactivated | Activated |
| Deactivated | Activated | Activated | Activated |
| Activated | Deactivated | Deactivated | Deactivated |
| Activated | Deactivated | Activated | Activated |
| Activated | Activated | Deactivated | Activated |
| Activated | Activated | Activated | Activated |

In addition, when one or more of the information 3XF and the third mode signal DREF' are activated, the additional advanced signal 3XE may be deactivated.

When the information TR1 is activated and the information RR and the information TR2 are deactivated, the control signal generation unit 1010' may deactivate the piled signal 2PE regardless of whether the second mode signal 2PILED and the additional advanced signal 3XE have been activated or not. In other cases, when the second mode signal 2PILED or the additional advanced signal 3XE is activated, the control signal generation unit 1010' may activate the piled signal 2PE. For such an operation, the control signal generation unit 1010' may include logic gates AND3, AND4, NAND2, INV2, INV3, and OR2.

The refresh signal generation unit 1020 of FIG. 15 operates like the refresh signal generation unit 1020 of FIG. 10 except that it receives the combined command CREF' instead of the refresh command CREF and operates.

FIGS. 16A to 16D are diagrams for illustrating the operation of the memory device of FIG. 13.

The refresh command CREF is written in order of its application and indicated by CREF1-CREF16. FIGS. 16A to 16D described as an example that the information TR1 is activated when the refresh command CREF is applied 4 times, and the information RR is activated when the refresh command CREF is applied 8 times, and the information TR2 is activated when the refresh command CREF is applied 16 times.

FIG. 16A is a diagram illustrating the refresh operation of the memory device if the AR mode and TR1 and TR2 operations are set and an additional AR operation is set or a temperature is higher than a reference temperature.

The third mode signal DREF' may be activated because the AR mode has been set and a self-refresh operation has not been set. Furthermore, the information 3XF may be activated or the information HOT may be activated (not shown in FIG. 16A).

When the first to the third refresh commands CREF1-CREF3 are applied, the NR operation may be performed and the additional advanced signal 3XE may be activated. Accordingly, the refresh signal REF may be activated three times and each of the memory banks may be refreshed three times. When the fourth refresh command CREF4 is applied, the TR1 operation may be performed because the information TR1 is activated. Furthermore, the refresh signal REF may be twice activated and each of the memory banks may be twice refreshed because the additional advanced signal 3XE is deactivated.

The refresh operation having such a sequence may be repeated while the fifth to the fifteenth refresh commands CREF5-CREF15 are applied. When the sixteenth refresh command CREF16 is applied, the TR2 operation may be performed because the information TR2 is activated. Furthermore, the refresh signal REF may be activated three times and each of the memory banks may be refreshed three times because the additional advanced signal 3XE is activated. Thereafter, the aforementioned operation may be repeated.

Figure 16B:
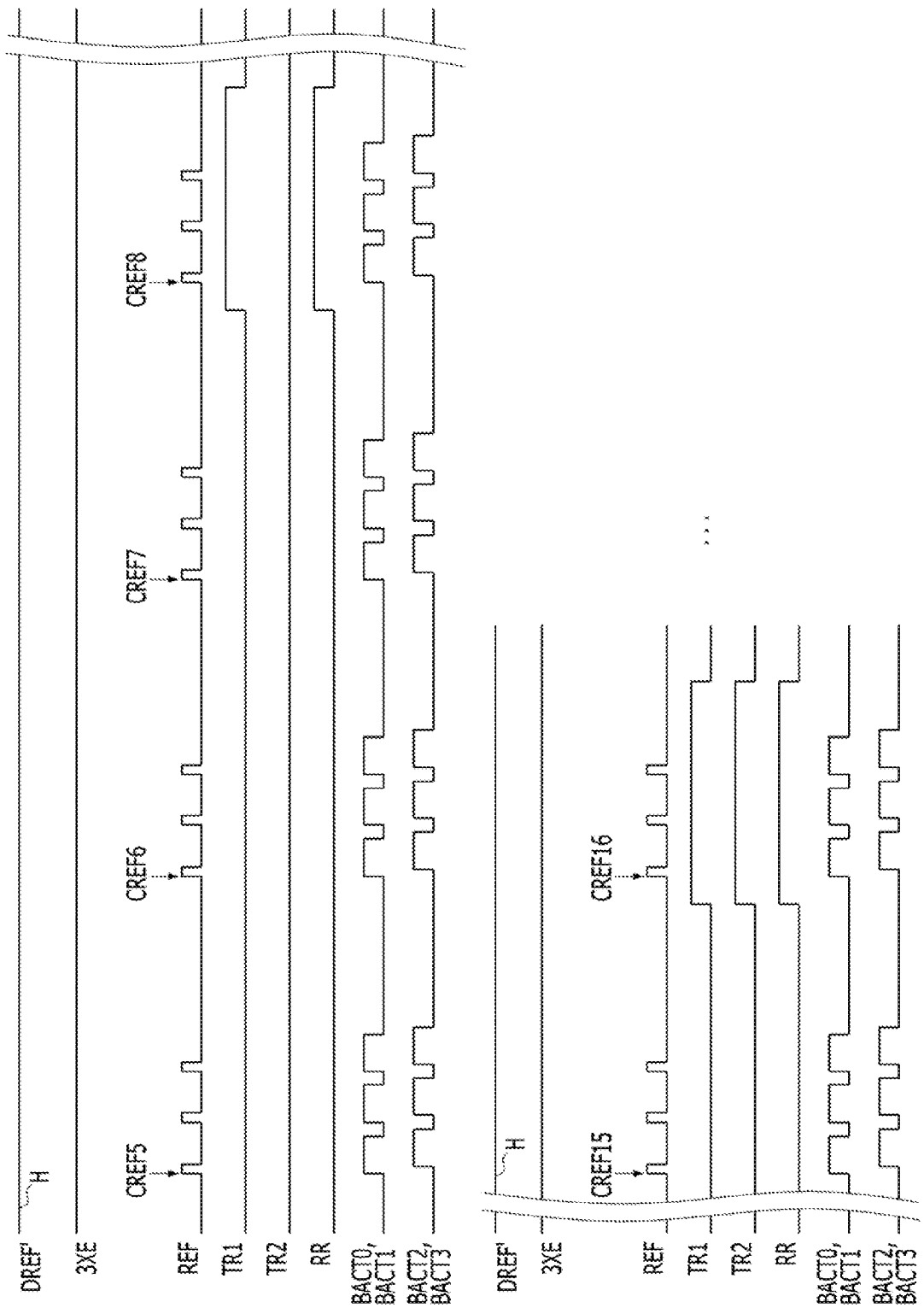

FIG. 16B is a diagram illustrating the refresh operation of the memory device if the AR mode and the TR1, RR, and TR2 operations are set and an additional AR operation is set or a temperature is higher than a reference temperature.

The third mode signal DREF' may be activated when the AR mode has been set and a self-refresh operation has not been set. Furthermore, the information 3XF may be activated or the information HOT may be activated (not shown in FIG. 16B).

When the first to the fourth refresh commands CREF1-CREF4 are applied, the memory device may operate the same as described with reference to FIG. 16A (not shown in FIG. 16B). When the fifth to the seventh refresh commands CREF5-CREF7 are applied, the memory device may operate the same as when the first to the third refresh commands CREF1-CREF3 are applied in the description of FIG. 16A.

When the eighth refresh command CREF8 is applied, the RR operation may be performed because the information RR is activated. When the ninth to the fifteenth refresh commands CREF9-CREF15 are applied, the memory device may operate the same as when the first to the seventh refresh commands CREF1-CREF7 are applied. When the sixteenth refresh command CREF16 is applied, the TR2 operation may be performed because the information TR2 is activated.

For reference, if the TR1 operation is performed, the refresh signal REF may be twice activated and each of the memory banks may be twice refreshed because the additional advanced signal 3XE is deactivated. In other cases, the refresh signal REF may be activated three times and each of the memory banks may be refreshed three times because the additional advanced signal 3XE is activated.

Figure 16C:
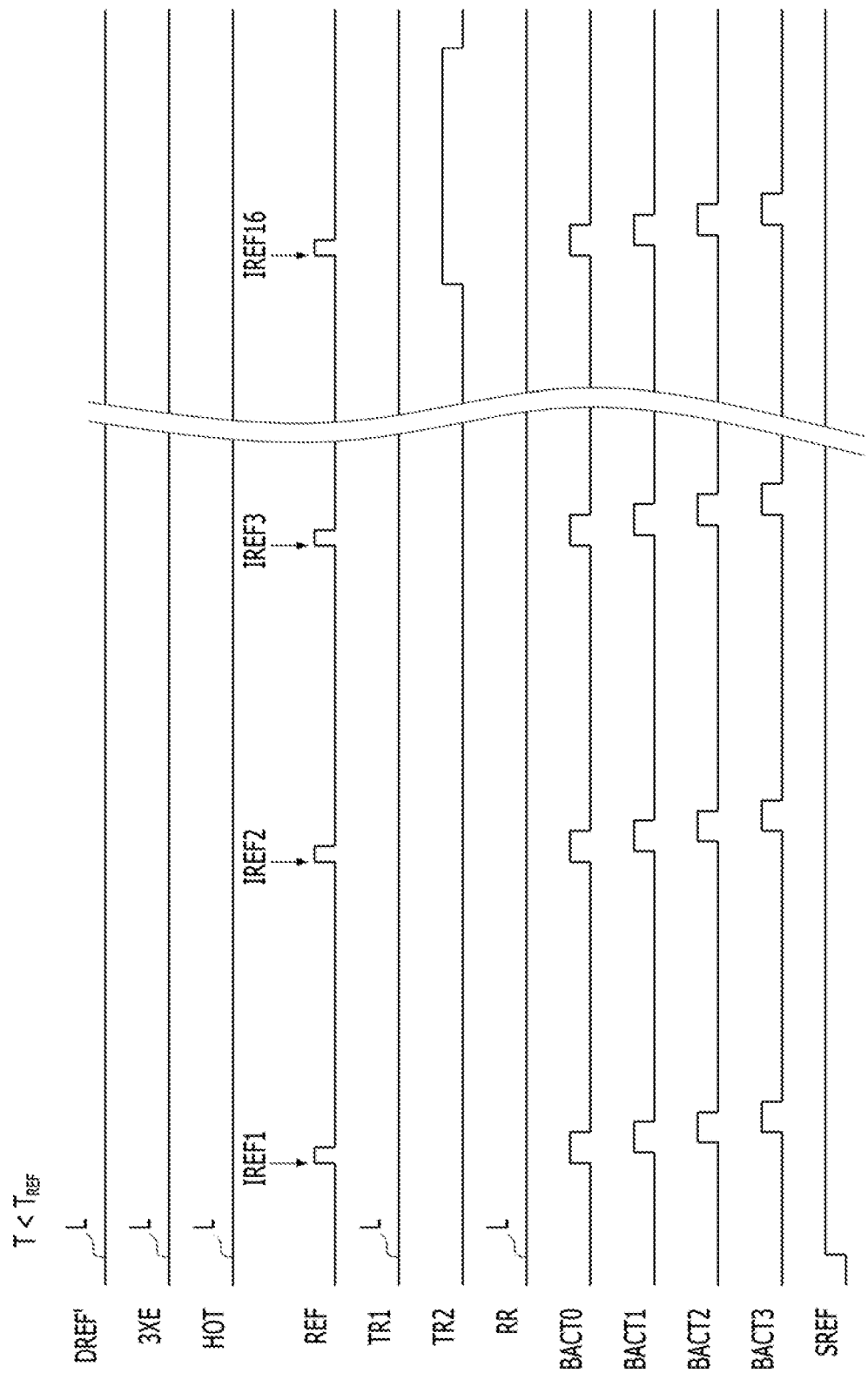

FIG. 16C is a diagram illustrating the self-refresh operation of the memory device if the TR2 operation is set and a temperature is lower than a reference temperature (i.e., $T<T_{REF}$).

The third mode signal DREF' may be deactivated because the self-refresh signal SREF has been activated and the information HOT has been deactivated.

When the first to the fifteenth internal refresh commands IREF1-IREF15 are applied, the NR operation may be performed. The refresh signal REF may be once activated, and each of the memory banks may be once refreshed. When the sixteenth internal refresh command ICREF16 is applied, the TR2 operation may be performed. The refresh signal REF may be once activated, and each of the memory banks may be once refreshed. Thereafter, the aforementioned operation may be repeated.

FIG. 16D is a diagram illustrating the self-refresh operation of the memory device if the TR2 operation is set and a temperature is higher than a reference temperature ($T>T_{REF}$).

The third mod signal DREF' may be activated because the self-refresh signal SREF has been activated and the information HOT has been activated.

When the first to the fifteenth internal refresh commands IREF1-IREF15 are applied, the NR operation may be performed. The refresh signal REF may be twice activated, and each of the memory banks may be twice refreshed. When the sixteenth internal refresh command IREF16 is applied, the TR2 operation may be performed. The refresh signal REF may be twice activated, and each of the memory banks may be twice refreshed. Thereafter, the aforementioned operation may be repeated.

For reference, FIGS. 16C and 16D describe as an example that the memory device performs a 4-piled refresh operation.

For reference, although not shown in FIGS. 16A and 16B, as described above with reference to FIGS. 7A and 7B, a refresh interval of each of memory banks, a refresh interval between different groups of memory banks, and an activation section of word lines may be differently controlled, depending on the number of refresh times (i.e., two or three). It has been described as an example that the number of refresh times is two or three, and the piled refresh mode is the 2-piled or 4-piled refresh mode, and that the TR1 operation is performed when the refresh command is inputted four times, and the RR operation is performed when the refresh command is inputted 8 times, and the TR2 operation is performed when the refresh command is inputted 16 times. However, an embodiment of the present invention may not be limited thereto.

As described above with reference to FIGS. 13 to 16D, the memory device of FIG. 13 may prevent data from being lost due to various factors by covering various refresh operations in such a way as to flexibly change the number of refresh times and the piled mode and controlling corresponding specific timing.

In the aforementioned description, operations for changing the number of refresh times depending on the AR mode, the additional AR operation, the piled refresh mode, the NR operation, the TR1 operation, the RR operation, the TR2 operation, and temperature information have been described. Such operations have been described with respect to the memory device of FIGS. 5 and 13 to which some combinations of them may applied, but various combinations in addition to the aforementioned combinations may be applied to the memory device.

In accordance with this technology, the number of times that memory banks are refreshed at one refresh command may be flexibly controlled according to various conditions in response to the number of memory banks on which a refresh operation is performed at the same time in the memory device.

Although various embodiments have been described for illustrative purposes, it will be apparent to those skilled in the art that various changes and modifications may be made without departing from the spirit and scope of the invention as defined in the following claims.

What is claimed is:

1. A memory device, comprising:
   a plurality of memory banks;
   a setting circuit capable of setting at least one of an advanced refresh mode and a piled refresh mode; and
   a refresh control unit capable of controlling the plurality of memory banks into a plurality of groups and for activating the plurality of groups to be refreshed at different times when a refresh command is applied,
   wherein the refresh control unit divides the memory banks into first groups determined based on the piled refresh mode and refreshes the first groups once, while, in the advanced refresh mode, the refresh control unit divides the memory banks into second groups determined based on the piled refresh mode and additional setting information and refresh the second groups a first number of times, which is more than two and determined based on the additional setting information.

2. The memory device of claim 1, wherein when the refresh command is once applied, the plurality of memory banks are refreshed one time.

3. The memory device of claim 1, wherein when the refresh command is once applied, the plurality of memory banks are refreshed multiple times.

4. The memory device of claim 1, wherein the additional setting information is updated whenever the refresh command is applied.

5. The memory device of claim 1, wherein:
   each of the plurality of memory banks comprises a plurality of word lines and one or more redundancy word lines capable of replacing one or more of the plurality of word lines; and
   the memory device further comprises a plurality of address storage units capable of storing addresses of one or more word lines of a corresponding memory bank of the plurality of memory banks.

6. The memory device of claim 5, wherein the additional setting information comprises one or more of information for setting the first number as three or more, temperature information, first target refresh information for setting a first target refresh operation of first word lines adjacent to a second word line corresponding to an address stored in the plurality of address storage units, second target refresh information for setting a second target refresh operation of the second word line, and redundancy refresh information for setting a refresh operation of the one or more redundancy word lines.

7. The memory device of claim 1, wherein the refresh control unit comprises:
   a control signal generation unit capable of generating an additional advanced signal and a piled signal based on whether the advanced refresh mode and the piled refresh mode are set, and the additional setting information;
   a refresh signal generation unit capable of activating a refresh signal at a number of times and an interval determined by whether the advanced refresh mode is set and the additional advanced signal when the refresh command is applied; and
   a bank refresh signal generation unit capable of generating a plurality of bank refresh signals corresponding to the plurality of memory banks, wherein the bank refresh signal generation unit divides the plurality of bank refresh signals into groups determined by the piled signal and activates the groups at an interval determined by the piled signal.

8. The memory device of claim 7, further comprising:
   a bank active control unit capable of generating bank active signals corresponding to the plurality of memory banks, wherein the bank active control unit activates a bank active signal, among the plurality of bank active signals, corresponding to a bank address, or activates the bank active signal corresponding to an activated bank refresh signal among the plurality of bank refresh signals at an interval determined by the additional advanced signal, when the active command is applied.

9. The memory device of claim 8, wherein each of the plurality of memory banks activates a word line or a redundancy word line selected by a control address in a section in which a corresponding bank active signal, among the plurality of bank active signals, is activated.

10. The memory device of claim 9, wherein:
    the control address comprises an input address when an active operation is performed;
    the control address comprises a counting address when a normal refresh operation is performed;
    the control address comprises an address generated by adding or subtracting a specific value to or from an address stored in the plurality of address storage units when a first target refresh operation is performed,
    the control address comprises the address stored in the plurality of address storage units when a second target refresh operation is performed, and
    the control address comprises a redundancy address when a redundancy refresh operation is performed.

11. The memory device of claim 1, wherein the refresh control unit adjusts an interval at which each of the second groups is refreshed, based on the first number of times that each of the second groups is refreshed in response to one refresh command.

12. The memory device of claim 1, wherein the refresh control unit adjusts an interval at which the first or second groups are refreshed therebetween, based on the number of first or second groups and a number of times that each of the first or second groups is refreshed in response to one refresh command.

13. The memory device of claim 1, further comprising:
a bank active control unit capable of controlling an active operation of the memory banks, wherein the bank active control unit adjusts an active section of the plurality of memory banks based on the number of times that the plurality of memory banks is refreshed in response to one refresh command.

14. A memory device, comprising:
a plurality of memory banks;
a setting circuit capable of setting an advanced refresh mode and a piled refresh mode; and
a refresh control unit capable of controlling the plurality of memory banks to be divided into groups and the groups to be refreshed at different times,
wherein when the refresh command is applied, the refresh control unit divides the memory banks into first groups determined based on the piled refresh mode and refreshes the first groups once, while, in the advanced refresh mode, the refresh control unit divides the memory banks into second groups determined based on the piled refresh mode and additional setting information and refresh the second groups two times or three or more times.

15. The memory device of claim 14, wherein, the additional setting information is updated whenever the refresh command is applied.

16. The memory device of claim 14, wherein:
each of the plurality of memory banks comprises a plurality of word lines and one or more redundancy word lines capable of replacing one or more of the plurality of word lines; and
the memory device further comprises a plurality of address storage units capable of storing addresses of one or more word lines of a corresponding memory bank of the plurality of memory banks.

17. The memory device of claim 14, wherein the additional setting information comprises one or more of additional advanced refresh information for setting an additional advanced refresh operation of the second groups, target refresh information for setting a target refresh operation of word lines adjacent to a word line corresponding to an address stored in the plurality of address storage units, and redundancy refresh information for setting a redundancy refresh operation of the one or more redundancy word lines.

18. The memory device of claim 17, wherein the refresh control unit is capable of:
controlling the second groups to be refreshed two times when the refresh command is applied in case where the additional advanced refresh operation is not set by the additional advanced refresh information,
controlling the second groups to be refreshed two times when the refresh command is applied in case where the additional advanced refresh operation and the target refresh operation are set by the additional advanced refresh information and the target refresh information, and
controlling the second groups to be refreshed three or more times when the refresh command is applied in case where the additional advanced operation is set by the additional advanced refresh information and the target refresh operation is not set by the target refresh information.

19. The memory device of claim 18, wherein the refresh control unit is capable of:
dividing the plurality of memory banks into M groups and refreshing the M groups at different times in case where the plurality of memory banks are to be refreshed two times in response to one refresh command; and
dividing the plurality of memory banks into N groups and refreshing the N groups at different times in case where the plurality of memory banks are to be refreshed three or more times in response to one refresh command,
wherein M and N are natural numbers, and N is smaller than M.

20. The memory device of claim 18, wherein the refresh control unit controls each of the second groups to be refreshed at a shorter interval when refreshed three or more times than two times.

21. The memory device of claim 18, wherein the refresh control unit controls the second groups to be refreshed at a shorter interval therebetween when refreshed three or more times than two times.

22. The memory device of claim 18, further comprising:
a bank active control unit capable of controlling an active operation of the memory banks when an active command is applied or the refresh command is applied, wherein the bank active control unit controls the plurality of memory banks to be activated in a shorter section when refreshed three or more times than two times, in response to one refresh command.

* * * * *